(12) United States Patent
Tu et al.

(10) Patent No.: US 11,011,491 B2
(45) Date of Patent: May 18, 2021

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Shun-Tsat Tu, Kaohsiung (TW); Pei-Jen Lo, Kaohsiung (TW); Fong Ren Sie, Kaohsiung (TW); Cheng-En Weng, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/563,701

(22) Filed: Sep. 6, 2019

(65) Prior Publication Data
US 2021/0074669 A1 Mar. 11, 2021

(51) Int. Cl.
*H01L 23/00* (2006.01)

(52) U.S. Cl.
CPC .............. *H01L 24/73* (2013.01); *H01L 24/03* (2013.01); *H01L 24/05* (2013.01); *H01L 24/11* (2013.01); *H01L 24/13* (2013.01); *H01L 24/16* (2013.01); *H01L 24/27* (2013.01); *H01L 24/29* (2013.01); *H01L 24/32* (2013.01); *H01L 2224/03616* (2013.01); *H01L 2224/0401* (2013.01); *H01L 2224/05018* (2013.01); *H01L 2224/05561* (2013.01); *H01L 2224/13007* (2013.01); *H01L 2224/13016* (2013.01); *H01L 2224/13021* (2013.01); *H01L 2224/16145* (2013.01); *H01L 2224/29028* (2013.01); *H01L 2224/29034* (2013.01); *H01L 2224/32145* (2013.01); *H01L 2224/73104* (2013.01); *H01L 2224/73204* (2013.01); *H01L 2924/351* (2013.01)

(58) Field of Classification Search
CPC ........ H01L 24/73; H01L 24/03; H01L 24/05; H01L 24/11; H01L 24/13; H01L 24/16; H01L 24/27; H01L 24/29; H01L 24/32; H01L 2224/03616; H01L 2224/0401; H01L 2224/05018; H01L 2224/05561; H01L 2224/13007; H01L 2224/13016; H01L 2224/13021; H01L 2224/16145; H01L 2224/29028; H01L 2224/29034; H01L 2224/32145; H01L 2224/73104; H01L 2924/351
USPC ......................................................... 257/737
See application file for complete search history.

(56) References Cited

U.S. PATENT DOCUMENTS

| 9,443,796 | B2 | 9/2016 | Chou et al. | |
|---|---|---|---|---|
| 2006/0057835 | A1* | 3/2006 | Anderson | H01L 23/53295 438/619 |
| 2014/0264948 | A1* | 9/2014 | Chou | H01L 21/3081 257/777 |

* cited by examiner

*Primary Examiner* — Tong-Ho Kim
(74) *Attorney, Agent, or Firm* — Foley & Larder LLP

(57) ABSTRACT

A semiconductor device package includes a connection structure having a first portion and a second portion extending from the first portion, the second portion having a width less than the first portion; and a dielectric layer surrounding the connection structure, wherein the dielectric layer and the second portion of the connection structure defines a space.

27 Claims, 45 Drawing Sheets

SEMICONDUCTOR DEVICE PACKAGES AND METHODS OF MANUFACTURING THE SAME

BACKGROUND

1. Field of the Disclosure

The present disclosure relates to, amongst other things, semiconductor device packages and methods of manufacturing the same.

2. Description of Related Art

A semiconductor device package may include some semiconductor devices stacked to one another. Hybrid bonding technique, which may refer to bonding that involves two or more materials (e.g. Cu-to-Cu bonding and dielectric-to-dielectric bonding), can be used to form the semiconductor device package. However, coefficient of thermal expansion (CTE) mismatch of two or more materials during or subsequent to thermal cycle(s) may result in delamination issue (e.g. delamination occurs on the interface of two dielectric layers), which adversely affect reliability or performance of the semiconductor device package.

SUMMARY

According to some example embodiments of the instant disclosure, a semiconductor device package includes a connection structure and a dielectric layer. The connection structure has a first portion and a second portion extending from the first portion. The second portion has a width less than the first portion. The dielectric layer surrounds the connection structure. The dielectric layer and the second portion of the connection structure define a space.

According to some example embodiments of the instant disclosure, a semiconductor device package includes a connection structure and a dielectric layer. The connection structure has a first portion and a second portion disposed on the first portion. The dielectric layer exposes part of an upper surface of the first portion of connection structure. The dielectric layer and the exposed part of the upper surface of the first portion of connection structure define a space.

According to some example embodiments of the instant disclosure, a method of manufacturing a semiconductor device package includes: forming a first portion of a connection structure on a substrate; forming a second portion of a connection structure on the first portion; and forming a dielectric layer to surround the connection structure and to define a space with the connection structure.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
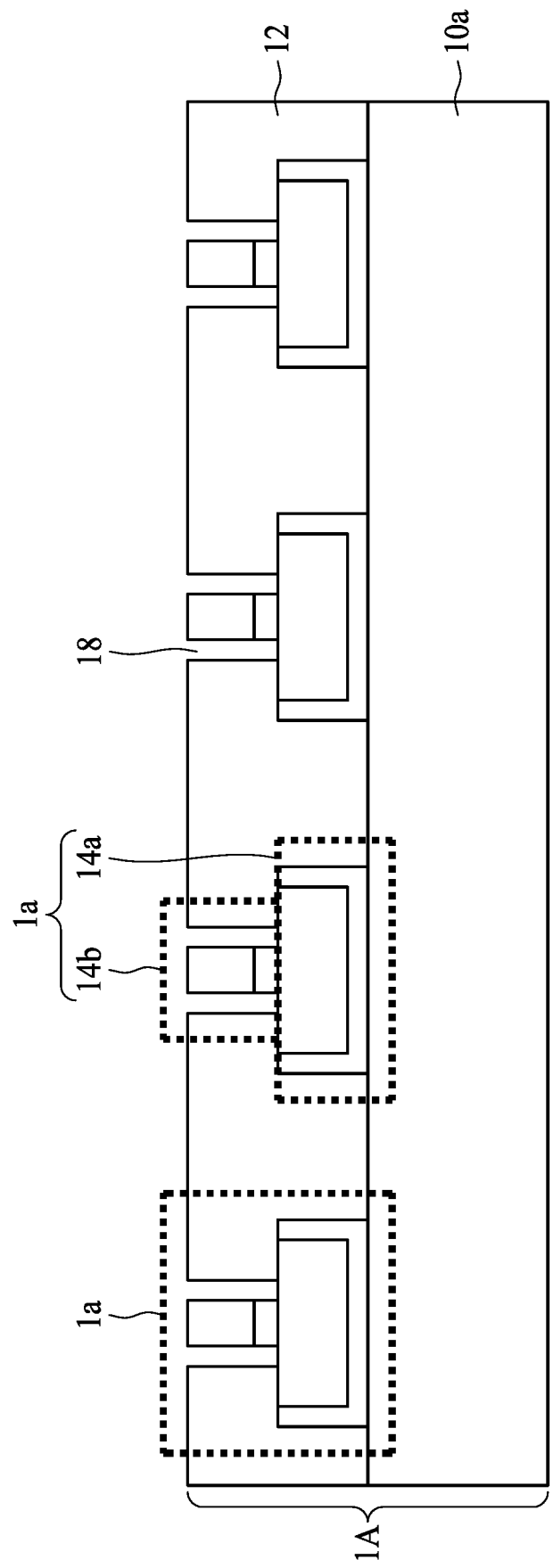
FIG. 1A is a cross-sectional view of a semiconductor device in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-sectional view of a semiconductor device 1A in accordance with some embodiments of the present disclosure.

Referring to FIG. 1A, the semiconductor device 1A can include, for example but is not limited to, a microcontroller (MCU), a microprocessor (e.g., single or multi-core), a memory device, a memory controller, a chipset, a graphics device, a high bandwidth memory (HBM), or an application-specific integrated circuit (ASIC), etc.

The semiconductor device 1A can include a carrier 10a, some connection structures 1a, and a dielectric layer 12.

The carrier 10a can include semiconductor material, glass or other suitable material(s).

The carrier 10a can include a circuitry (not shown in FIG. 1A) electrically connected to the connection structures 1a. The carrier 10a can include a redistribution layer (RDL) structure (not shown in FIG. 1A) electrically connected to the connection structures 1a. The semiconductor substrate 10a can include conductive pad(s), trace(s) or via(s) (not shown in FIG. 1A) electrically connected to the connection structures 1a.

The connection structures 1a can include conductive material, for example but is not limited to, copper (Cu), gold (Au), aluminum (Al), or other suitable material.

The connection structure 1a can be surrounded by the dielectric layer 12. The connection structure 1a can be enclosed by the dielectric layer 12.

The connection structure 1a can be covered by a dielectric layer 12. The connection structure 1a can be partially covered by a dielectric layer 12.

The connection structure 1a can be embedded within the dielectric layer 12. The connection structures 1a can be separated or spaced apart from one another. A connection structure 1a can be separated from another connection structure 1a by a distance. The connection structures 1a can be separated or spaced apart by the dielectric layer 12.

The connection structure 1a can include two portions 14a and 14b. The portion 14a may be formed or disposed on the carrier 10a. The portion 14b may be formed or disposed on the portion 14a. The portions 14a and 14b can have different widths. The portion 14a can have a width greater than the portion 14b.

The portion 14a can include an upper surface (not denoted in FIG. 1A), a lower surface (not denoted in FIG. 1A) and a lateral surface (not denoted in FIG. 1A) extended between the upper surface and the lower surface. The lower surface of the portion 14a can be in direct contact with the carrier 10a. The lateral surface of the portion 14a can be in direct contact with the dielectric layer 12. The upper surface of the portion 14a can be in direct contact with the portion 14b. The upper surface of the portion 14a can be exposed. The upper surface of the portion 14a can be in direct contact with the dielectric layer 12.

The portion 14b can include an upper surface (not denoted in FIG. 1A), a lower surface (not denoted in FIG. 1A) and a lateral surface (not denoted in FIG. 1A) extended between the upper surface and the lower surface. The lower surface of the portion 14b can be in direct contact with the portion 14a. The lateral surface of the portion 14b can be separated or spaced apart from the dielectric layer 12 by a space 18. The lateral surface of the portion 14b can be exposed. The lateral surface of the portion 14b can be exposed to the space 18.

Figure 1B:
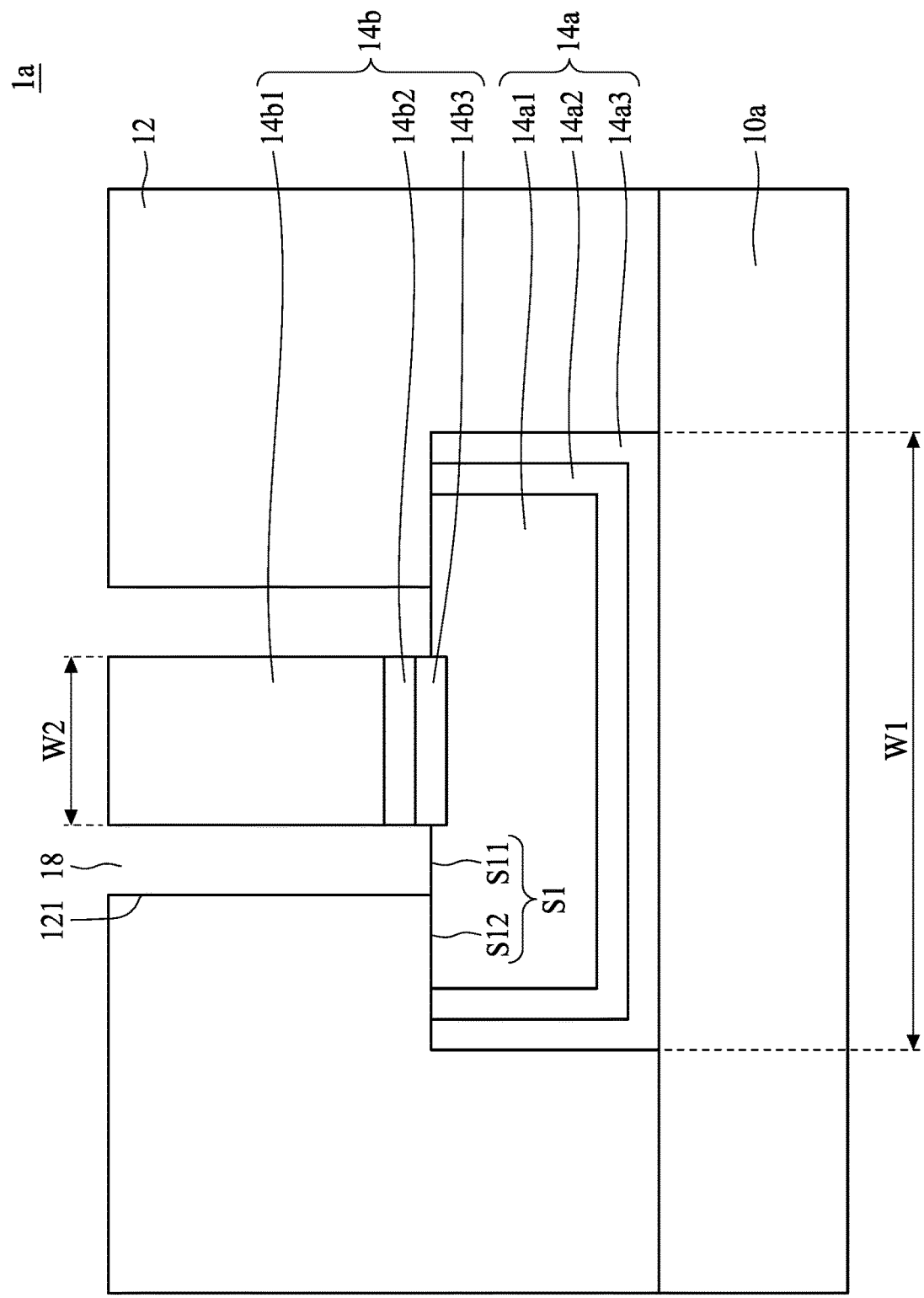
FIG. 1B is an enlarged view of the connection structure as shown in FIG. 1A.

FIG. 1B is an enlarged view of the connection structure 1a as shown in FIG. 1A.

Referring to FIG. 1B, the connection structure 1a can include two portions 14a and 14b. The portion 14a has a width W1, and the portion 14b has a width W2. The width W1 can be larger than the width W2.

The portion 14a can include some interconnection layers 14a1, 14a2 and 14a3.

The portion 14b can include some interconnection layers 14b1, 14b2 and 14b3.

Each of the interconnection layers 14a1, 14a2, 14a3, 14b1, 14b2 and 14b3 may include, for example but is not limited to, aluminum (Al), copper (Cu), titanium (Ti), tungsten (W) or other suitable material(s) (e.g. metal, alloy or non-metal conductive material(s)).

Part of the portion 14b can be embedded in the portion 14a. For example, part of the interconnection layer 14b3 can be embedded in the portion 14a.

The interconnection layer 14a1 can have a rectangle or a rectangle-like profile. The interconnection layer 14a1 can have a round or a round-like profile.

The interconnection layer 14a1 can surround the interconnection layer 14b3. The interconnection layer 14a1 can enclose the interconnection layer 14b3.

The interconnection layer 14a1 can be exposed to the space 18. The interconnection layer 14a1 can be exposed to the air in the space 18. The interconnection layer 14a1 can be covered by the dielectric layer 12. The interconnection layer 14a1 can be in direct contact with the dielectric layer 12.

The interconnection layer 14a2 can have a U shape or a U shape-like structure. The interconnection layer 14a2 can include a cup or cup-like structure. The interconnection layer 14a2 can surround the interconnection layer 14a1. The interconnection layer 14a2 can enclose the interconnection layer 14a1. The interconnection layer 14a2 can be in direct contact with the interconnection layer 14a1. The interconnection layer 14a2 can be in direct contact with the dielectric layer 12. The interconnection layer 14a2 can be covered by the dielectric layer 12. The interconnection layer 14a2 can be disposed between the interconnection layer 14a1 and the interconnection layer 14a3.

The interconnection layer 14a3 can have a U shape or a U shape-like structure. The interconnection layer 14a3 can include a cup or cup-like structure. The interconnection layer 14a3 can surround the interconnection layer 14a1. The interconnection layer 14a3 can surround the interconnection layer 14a2. The interconnection layer 14a3 can enclose the interconnection layer 14a1. The interconnection layer 14a3 can enclose the interconnection layer 14a2. The interconnection layer 14a3 can be in direct contact with the interconnection layer 14a2. The interconnection layer 14a3 can be in direct contact with the dielectric layer 12. The interconnection layer 14a3 can be in direct contact with the carrier 10a. The interconnection layer 14a3 can be covered by the dielectric layer 12. The interconnection layer 14a3 can be disposed between the interconnection layer 14a2 and the dielectric layer 12.

The interconnection layer 14b2 can be formed or disposed on the interconnection layer 14b3. The interconnection layer 14b1 can be formed or disposed on the interconnection layer 14b2. The interconnection layer 14b1 can have a width substantially the same to the interconnection layer 14b2. The interconnection layer 14b1 can have a width substantially the same to the interconnection layer 14b3.

A portion S11 of the upper surface S1 of the interconnection layer 14a1 can be exposed by the dielectric layer 12. The portion S11 of the upper surface S1 of the interconnection layer 14a1 can be exposed to the space 18. A portion S12 of the upper surface S1 of the interconnection layer 14a1 can be covered by the dielectric layer 12. The portion S12 of the upper surface S1 of the interconnection layer 14a1 can be in direct contact with the dielectric layer 12.

A lateral surface of the interconnection layer 14b2 can be exposed to the space 18. The lateral surface of the interconnection layer 14b2 can be in direct contact with the air in space 18. A lateral surface of the interconnection layer 14b1 can be exposed to the space 18. The lateral surface of the interconnection layer 14b1 can be in direct contact with the air in space 18.

The space 18 can be vacuum. There can be air in the space 18. The space 18 can be defined or surrounded by the portion S11 of the upper surface S1 of the interconnection layer 14a1, the lateral surface of the interconnection layer 14b1, the lateral surface of the interconnection layer 14b2, and the lateral surface of the dielectric layer 12. A boundary of the space 18 can be formed or defined by the portion S11 of the upper surface S1 of the interconnection layer 14a1, the lateral surface of the interconnection layer 14b1, the lateral surface of the interconnection layer 14b2, and the lateral surface of the dielectric layer 12.

Figure 1C:
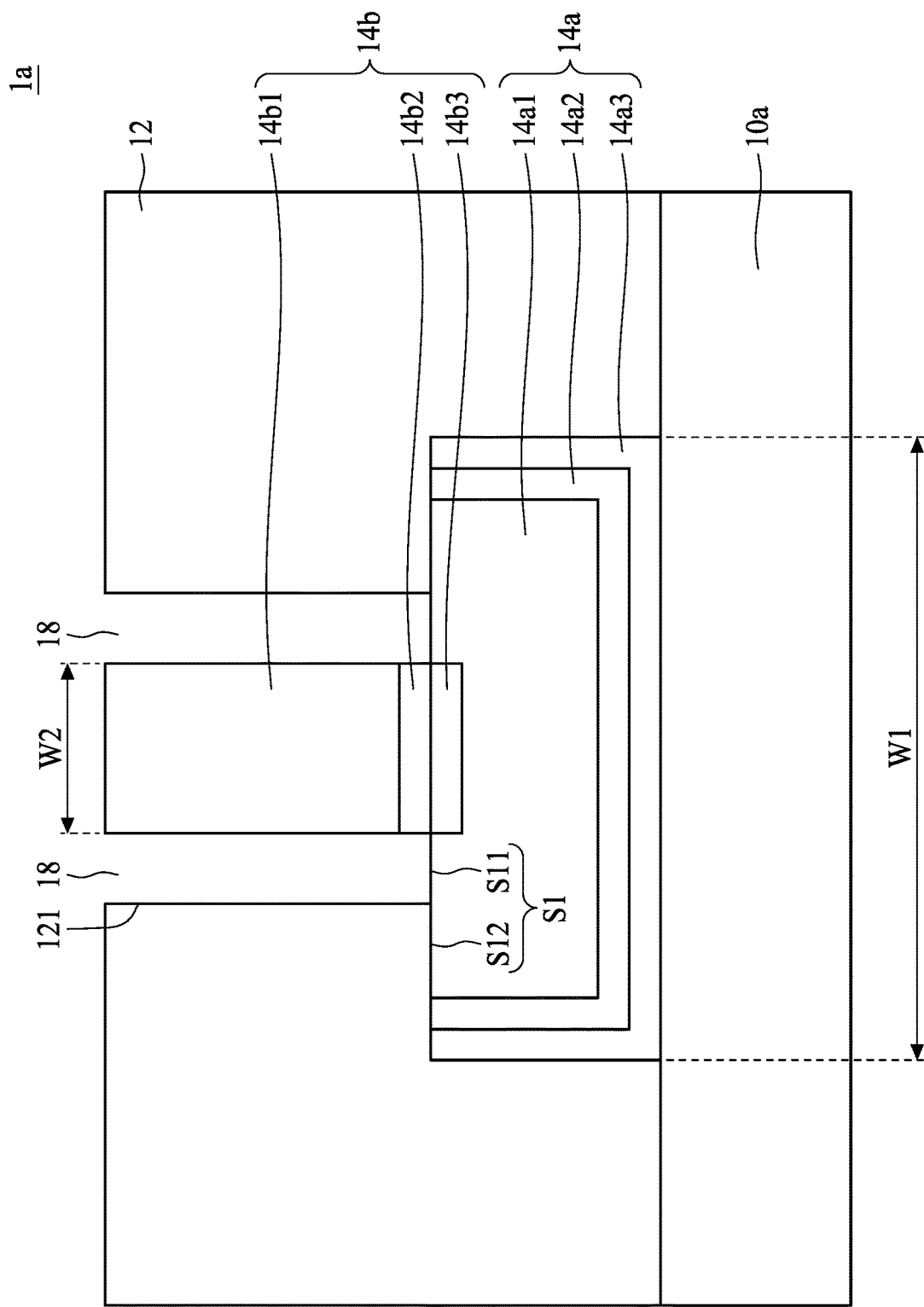
FIG. 1C is an enlarged view of the connection structure as shown in FIG. 1A.

FIG. 1C is an enlarged view of the connection structure 1a as shown in FIG. 1A.

Referring to FIG. 1C, the connection structure 1a is similar to the connection structure 1a as illustrated and described with reference to FIG. 1B, except that the interconnection layer 14b3 can be surrounded by the interconnection layer 14a1. The entire interconnection layer 14b3 can be surrounded by the interconnection layer 14a1. The interconnection layer 14b3 can be enclosed by the interconnection layer 14a1. The entire interconnection layer 14b3 can be enclosed by the interconnection layer 14a1. The interconnection layer 14b3 can be embedded within the interconnection layer 14a1. The entire interconnection layer 14b3 can be embedded within the interconnection layer 14a1. An upper surface of the interconnection layer 14a1 can be substantially coplanar with an upper surface of the interconnection layer 14b3.

Figure 1D:
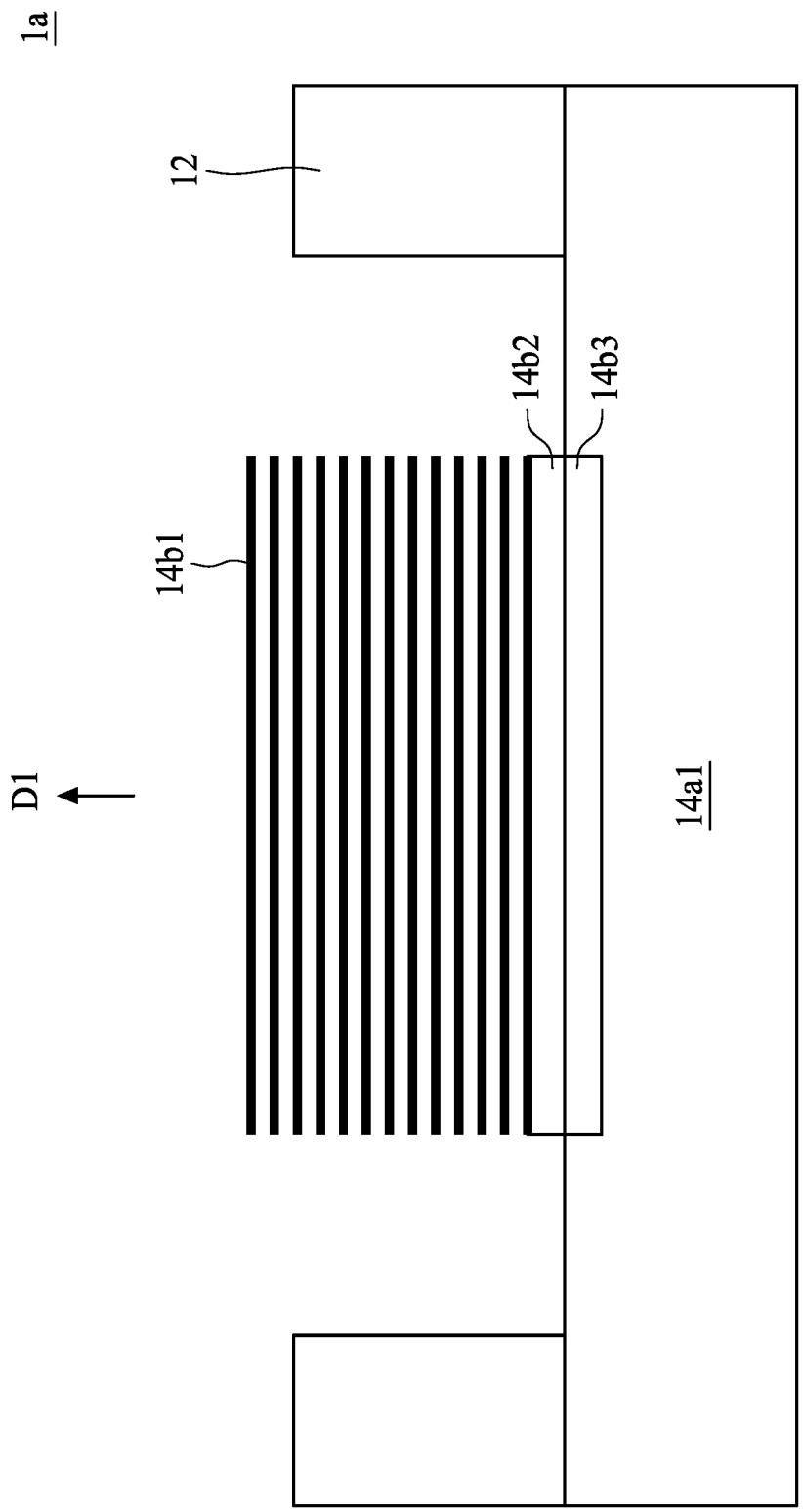
FIG. 1D illustrates lattice direction of the connection structure as shown in FIG. 1C.

FIG. 1D illustrates lattice direction of the connection structure as shown in FIG. 1C.

Referring to FIG. 1D, the interconnection layer 14b1 can have a crystal structure. The interconnection layer 14b1 can have a crystallographic direction or lattice direction as denoted by an arrow D1. The crystallographic direction or lattice direction D1 can include a direction of (111) (Miller indices).

Figure 1E:
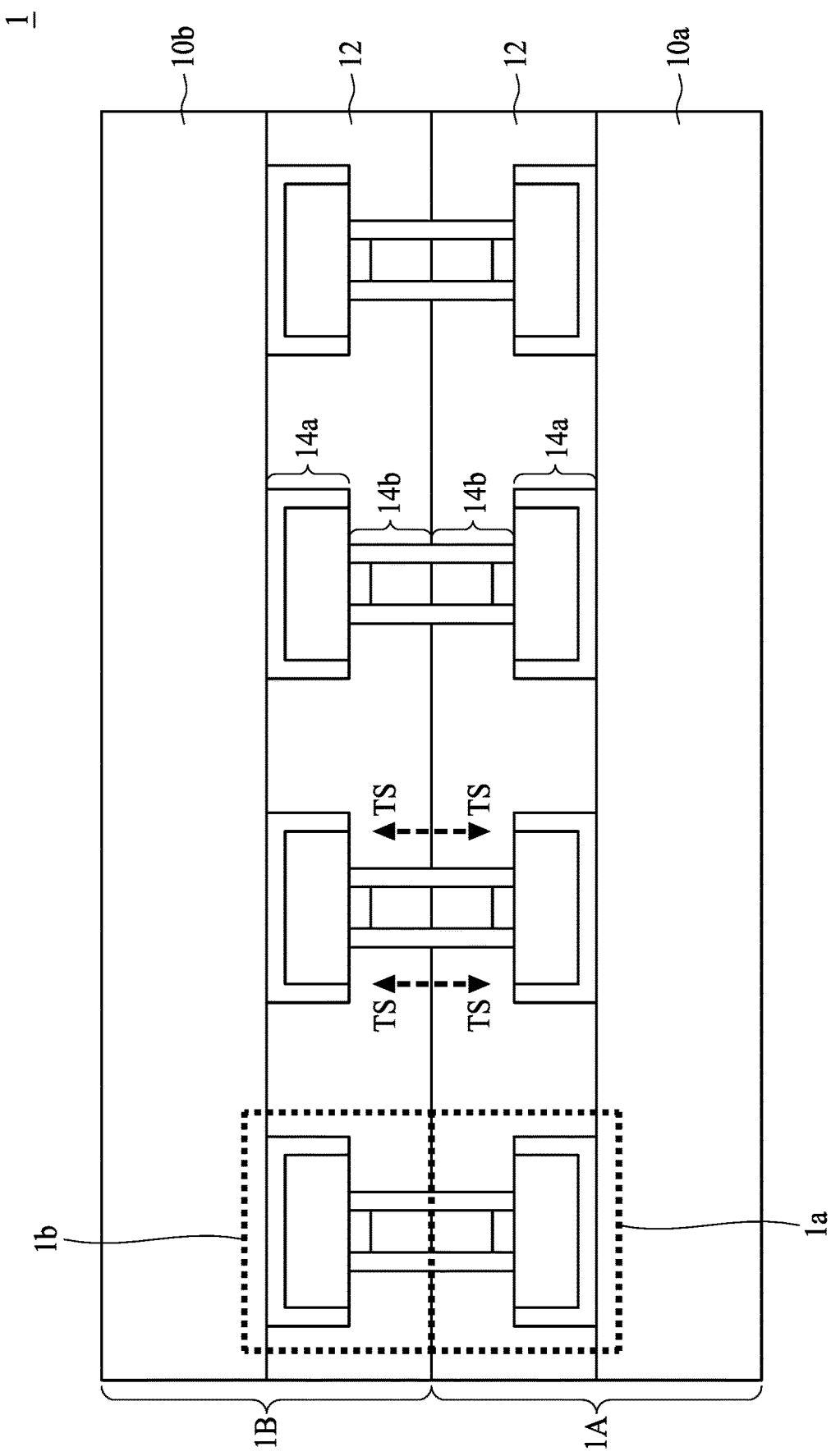
FIG. 1E is a cross-sectional view of a semiconductor device package in accordance with some embodiments of the present disclosure.

FIG. 1E is a cross-sectional view of a semiconductor device package 1 in accordance with some embodiments of the present disclosure.

Referring to FIG. 1E, the semiconductor device package 1 can include two semiconductor devices 1A and 1B. The semiconductor device 1A can include a plurality of connection structures 1a on the carrier 10a. The semiconductor device 1B can include a plurality of connection structures 1b on the carrier 10b.

The semiconductor device 1B can be same or similar to the semiconductor device 1A. The semiconductor device 1B can be different from the semiconductor device 1A.

The connection structure 1b can be same or similar to the connection structures 1a. The connection structure 1b can be different from the connection structures 1a.

Hybrid bonding technique can be used to form a semiconductor device package 1. The semiconductor device package 1 can be formed by heat and compression operation. Hybrid bonding can refer to bonding that involves two or more materials (e.g. metal-to-metal bonding and dielectric-to-dielectric bonding). The interconnection layer of the connection structure 1a (e.g. the interconnection layer 14b1) can be bonded to the interconnection layer of the connection structure 1b (e.g. the interconnection layer 14b1). The dielectric layer 12 of the connection structure 1a can be bonded to the dielectric layer 12 of the connection structure 1b.

The semiconductor device 1A can include the interconnection structure 1a having the lattice direction as shown in FIG. 1D. The semiconductor device 1B can include the interconnection structure 1b having the lattice direction as shown in FIG. 1D. Bonding between the interconnection layer 14b1 of the semiconductor device 1A and the interconnection layer 14b1 of the semiconductor device 1B can be performed or achieved at a relatively low temperature due to the lattice direction thereof (e.g. the (111) direction). In other words, relatively less heat is applied to bond the interconnection layer 14b1 of the semiconductor device 1A to the interconnection layer 14b1 of the semiconductor device 1B.

The interconnection layer 14b, which has relatively great coefficient of thermal expansion (CTE) than the dielectric layer 12, can be disposed apart from the dielectric layer 12 by the space 18. The space 18 may function as a buffer such that reliability issues (e.g. delamination issue) resulted from CTE mismatch during or subsequent to thermal cycle(s) can be mitigated or alleviated.

For example, tensile stress TS, which can be resulted from heat and compression operation, may remain in the dielectric layer 12 subsequent to the heat and compression operation. The residual tensile stress TS can delaminate the upper dielectric layer 12 from the lower dielectric layer 12. However, the interconnection layer 14a, which has relatively great width than the interconnection layer 14b, can function as a support structure which can resist the tensile stress TS. In other words, delamination that may happen or occur at the interface (or boundary) between the upper dielectric layer 12 and the lower dielectric layer 12 can be avoid.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, FIG. 2O and FIG. 2P illustrate various stages of a method for manufacturing a semiconductor device package 1 accordance with some embodiments of the subject application.

Figure 2A:
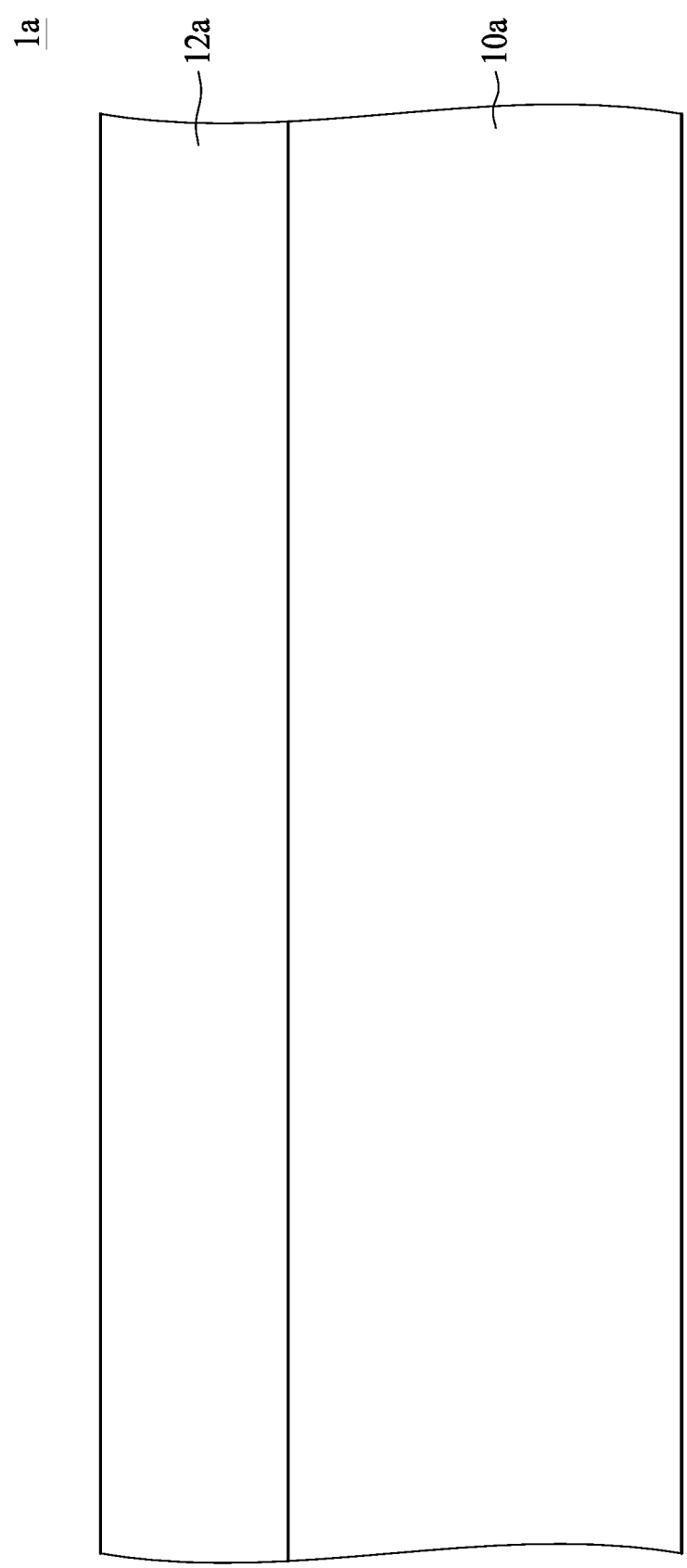
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, FIG. 2O and FIG. 2P illustrate various stages of a method for manufacturing a semiconductor device package accordance with some embodiments of the subject application.

Referring to FIG. 2A, the dielectric layer 12a can be formed or deposited the carrier 10a. The dielectric layer 12a can be formed by, for example but is not limited to, sputtering, deposition (e.g. chemical vapor deposition (CVD)) technique or other suitable technique(s). The dielectric layer 12a can include, for example but is not limited to, silicon oxide or other suitable material(s).

Figure 2B:
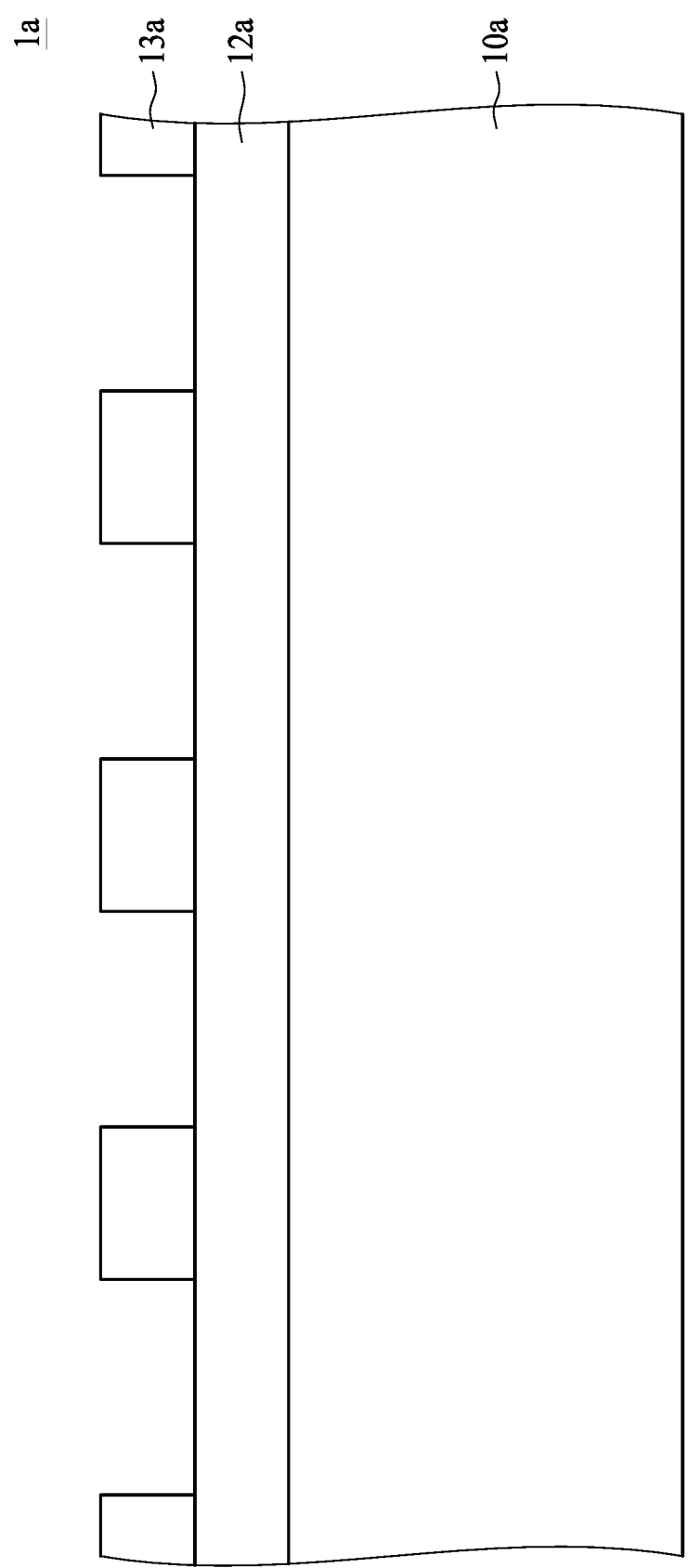

Referring to FIG. 2B, a patterned mask 13a can be formed on the dielectric layer 12a to expose the dielectric layer 12a. The patterned mask (or photomask) 13a can include, for example but is not limited to, photoresist (PR) material or other suitable material(s). The patterned mask 12a can be formed by, for example but is not limited to, photolithography technique (which may involve coating, exposure, developing) or other suitable technique(s).

Figure 2C:
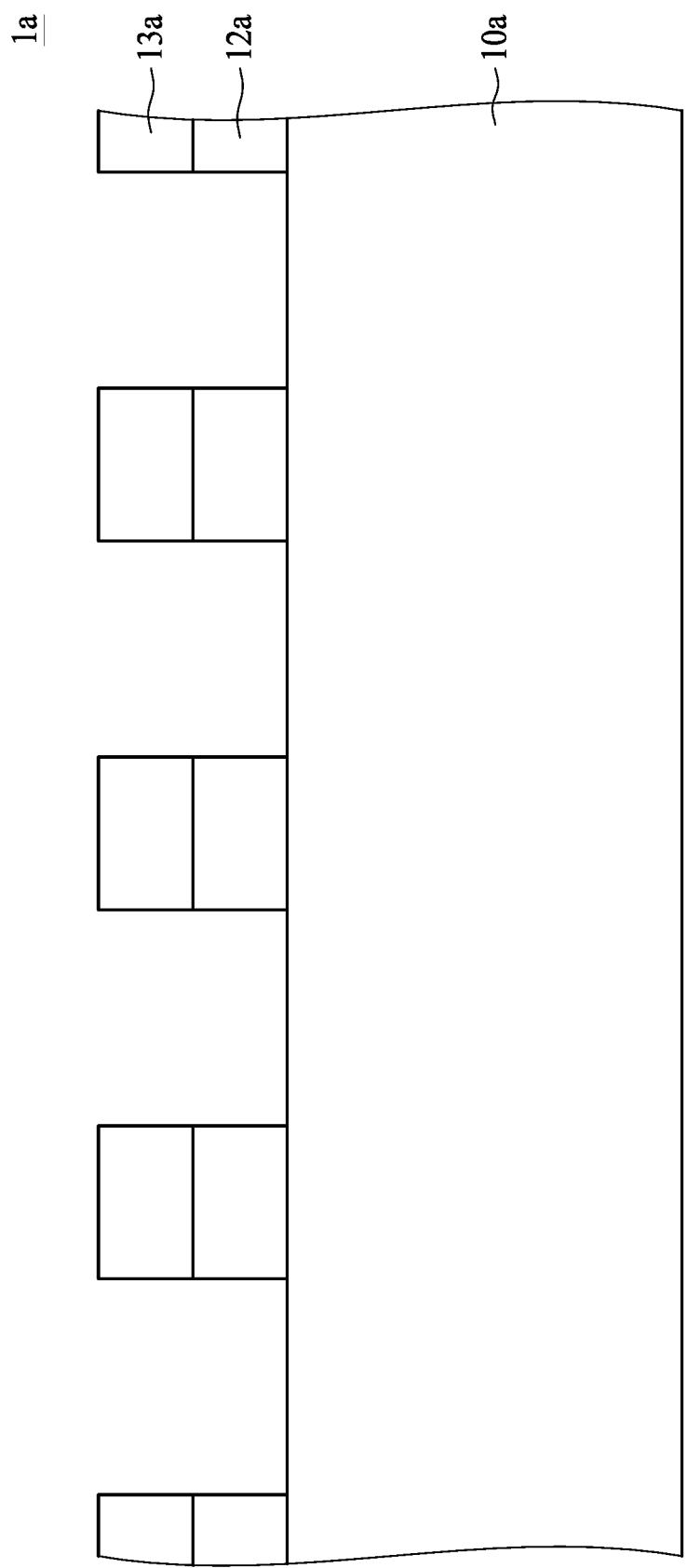

Referring to FIG. 2C, the portions of the dielectric layer 12a which are not covered by the patterned mask 13a can be removed. The removing operation can be performed by, for example but is not limited to, etching (e.g. dry etching) technique or other suitable technique(s).

Figure 2D:
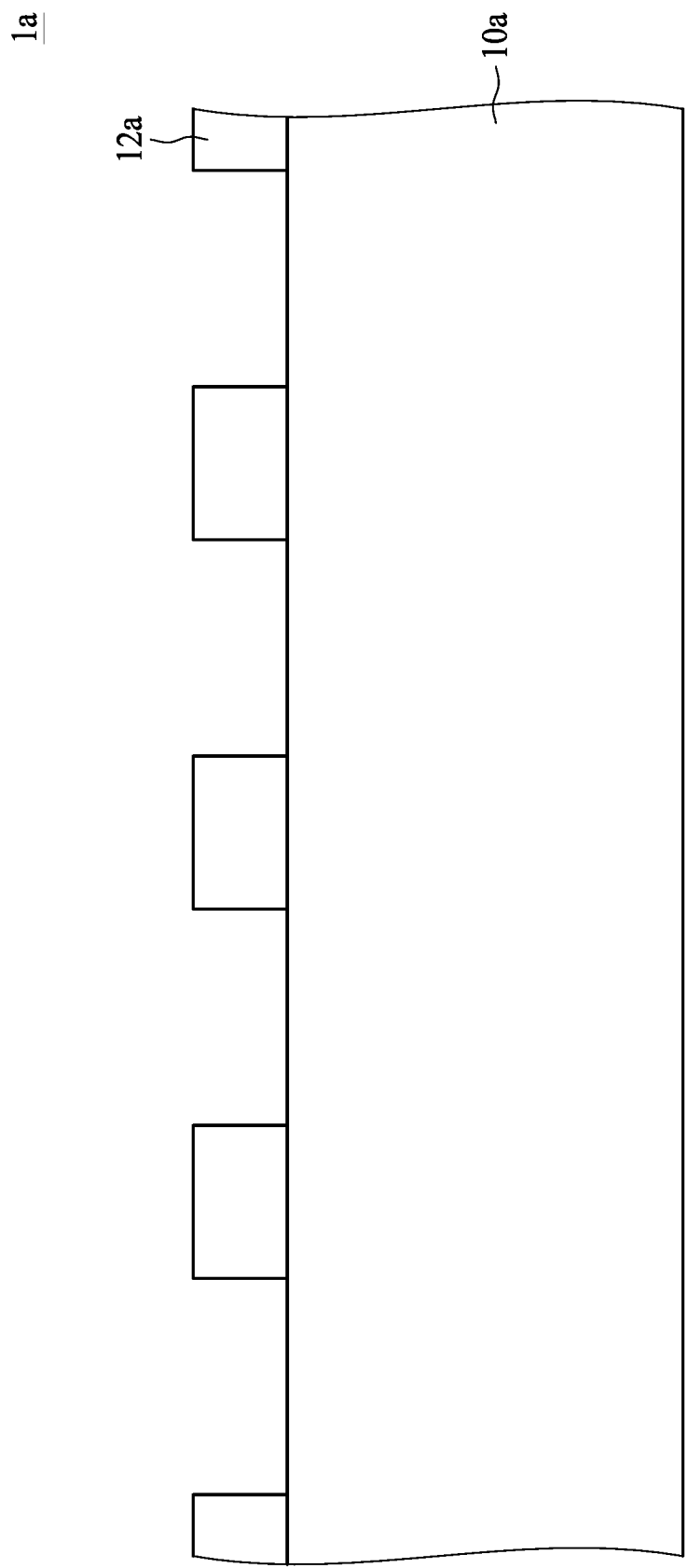

Referring to FIG. 2D, the patterned mask 13a can be removed. The patterned mask 13a can be removed by, for example but is not limited to, striping, etching or other suitable technique(s).

Figure 2E:
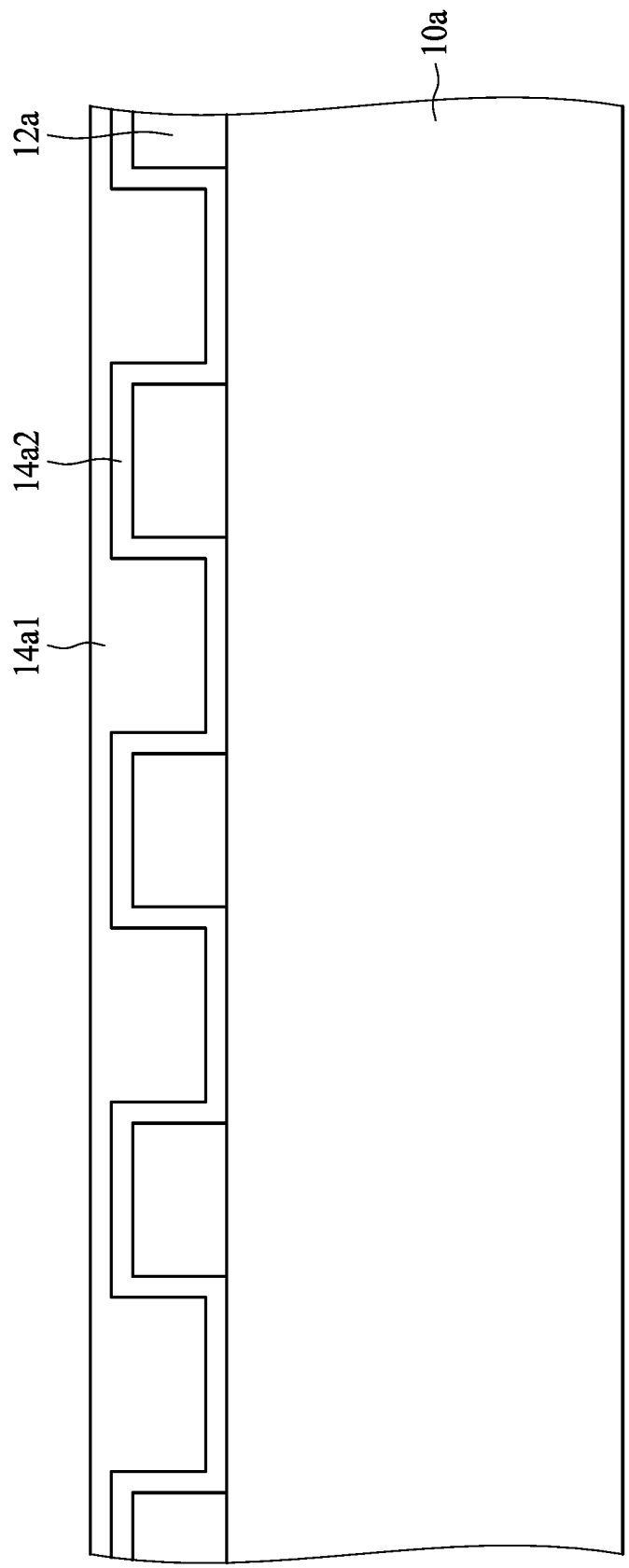

Referring to FIG. 2E, the interconnection layer 14a2 can be formed on the dielectric layer 12a and the disposed portions of the carrier 10a. The interconnection layer 14a1 can be formed on the interconnection layer 14a2. An interconnection layer 14a3 (not denoted in FIG. 2E) can be further included to surround the interconnection layer 14a3.

The interconnection layers 14a1 and 14a2 can be formed by, for example but is not limited to, sputtering, deposition (e.g. physical vapor deposition (PVD)) or other suitable technique(s). The interconnection layers 14a1 and 14a2 can be formed by, for example but is not limited to, etching or other suitable technique(s).

Figure 2F:
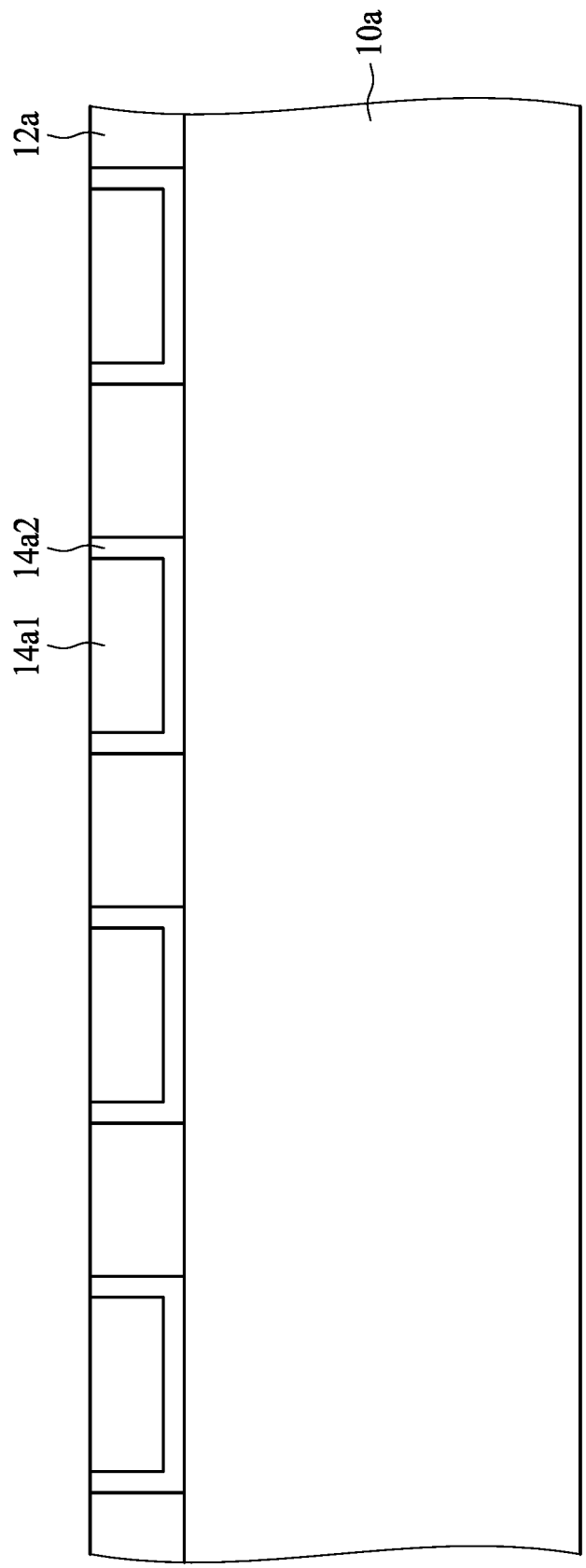

Referring to FIG. 2F, the planarization operation can be performed to expose the interconnection layer 14a2. The planarization operation can be formed by, for example but is not limited to, chemical mechanical polishing (CMP), grinding, dry polishing, etching or other suitable technique(s).

Figure 2G:
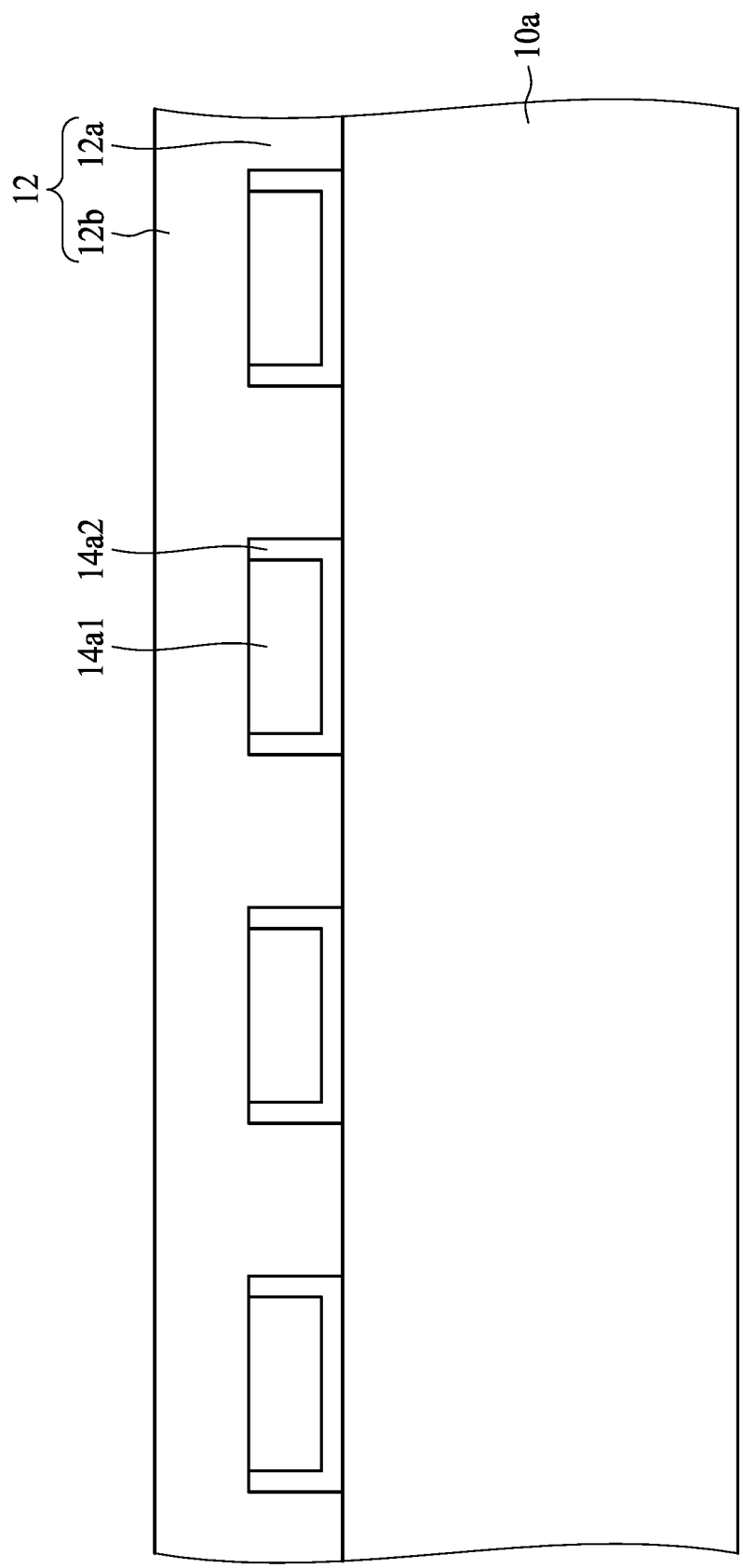

Referring to FIG. 2G, the dielectric layer 12b can be formed or deposited accordingly. The dielectric layer 12b can be formed by, for example but is not limited to, sputtering, deposition (e.g. chemical vapor deposition (CVD)) technique or other suitable technique(s). The dielectric layer 12b can include, for example but is not limited to, silicon oxide or other suitable material(s).

Figure 2H:
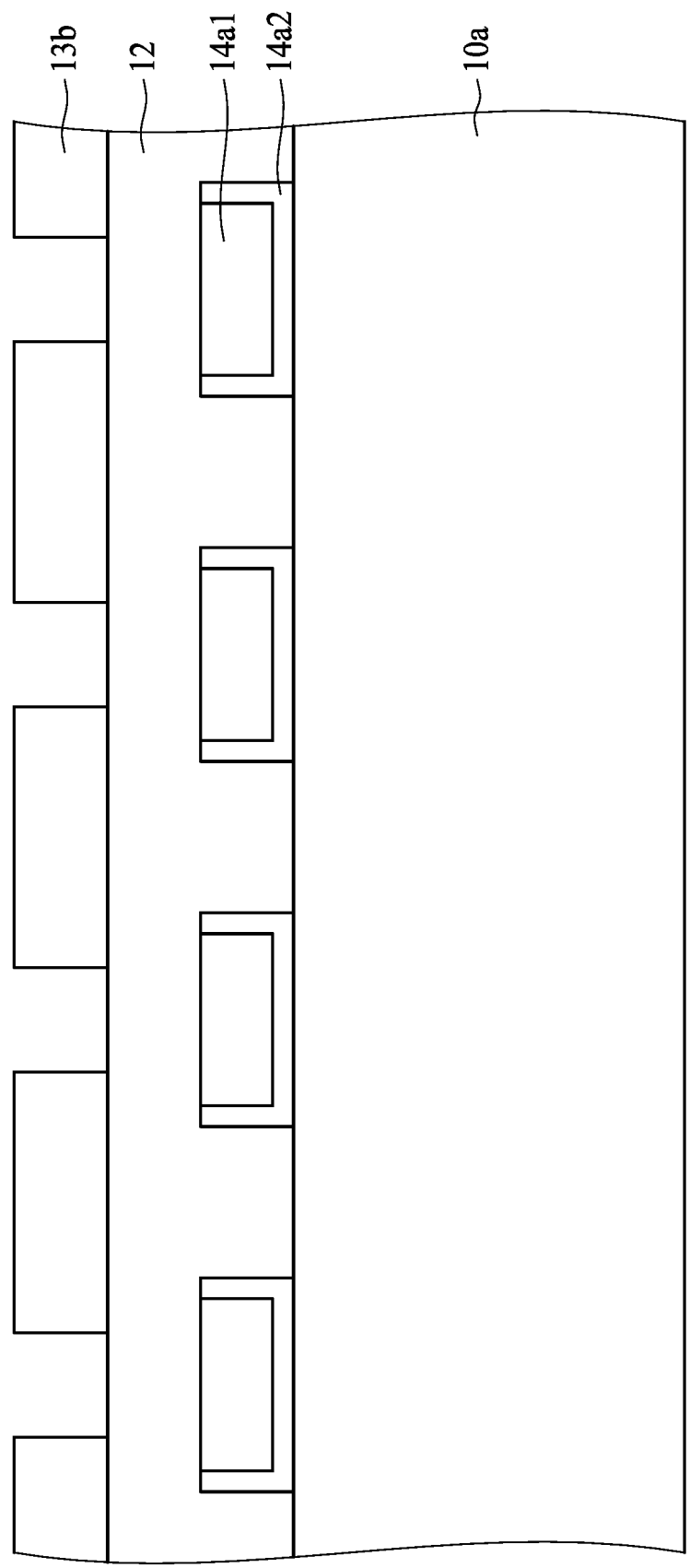

Referring to FIG. 2H, a patterned mask 13b can be formed on the dielectric layer 12 to expose the dielectric layer 12. The patterned mask (or photomask) 13b can include, for example but is not limited to, photoresist (PR) material or other suitable material(s). The patterned mask 13b can be formed by, for example but is not limited to, photolithography technique (which may involve coating, exposure, developing) or other suitable technique(s).

Figure 2I:
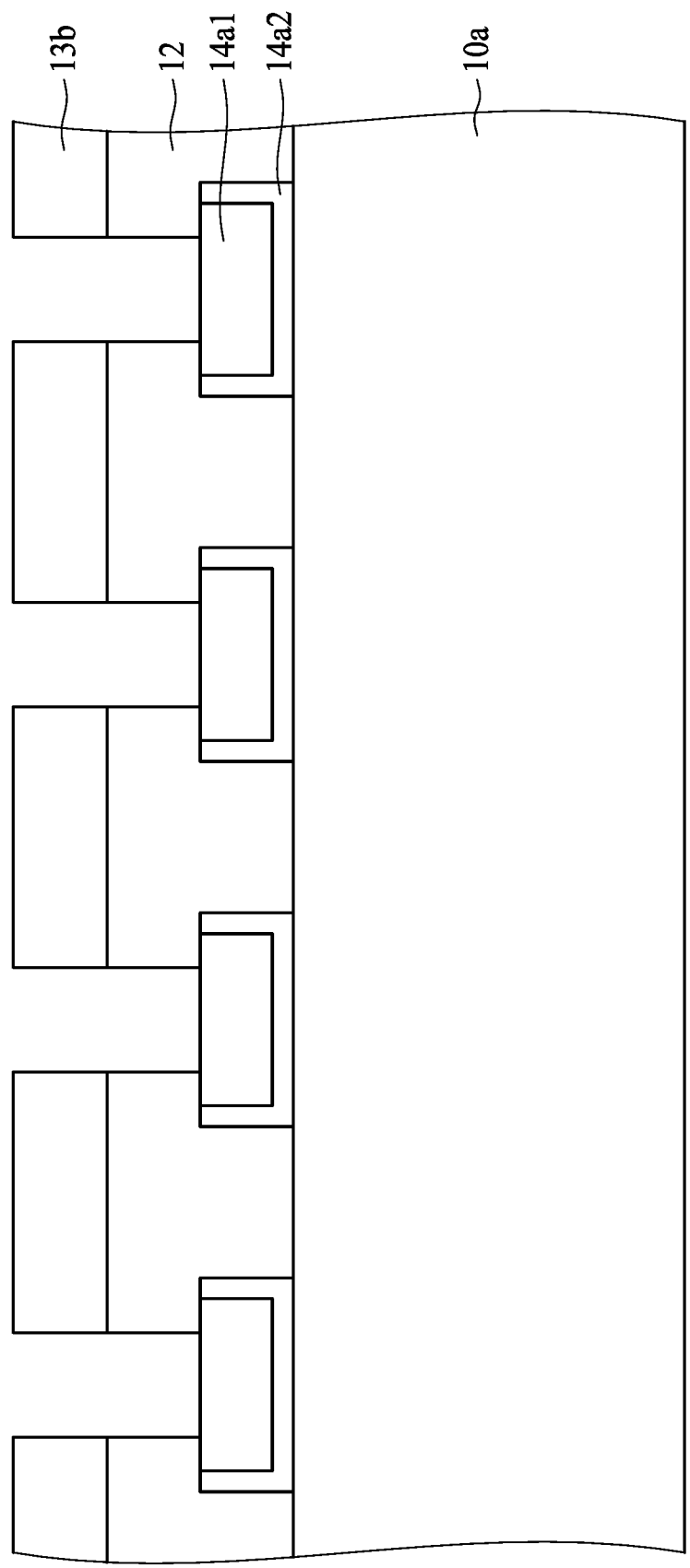

Referring to FIG. 2I, the portions of the dielectric layer 12 which are not covered by the patterned mask 13b can be removed. The removing operation can be performed by, for example but is not limited to, etching (e.g. dry etching) technique or other suitable technique(s).

Figure 2J:
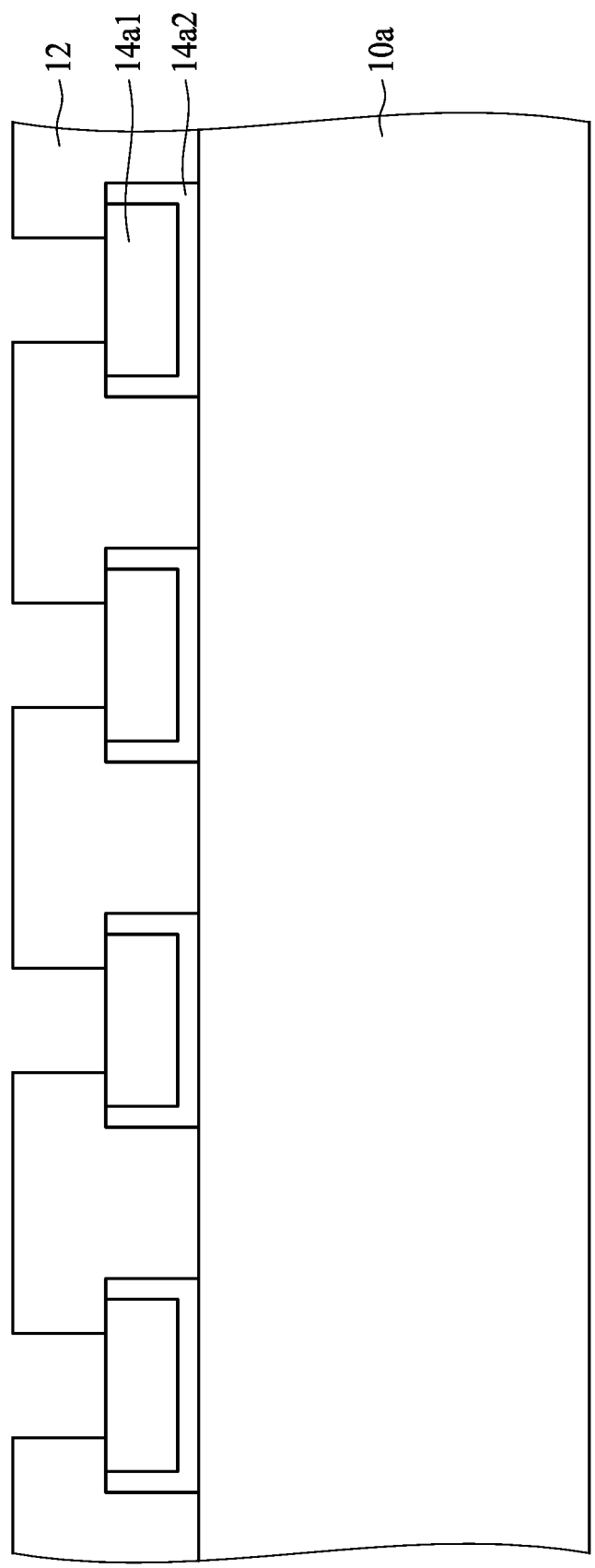

Referring to FIG. 2J, the patterned mask 13b can be removed. The patterned mask 13b can be removed by, for example but is not limited to, striping, etching or other suitable technique(s).

Figure 2K:
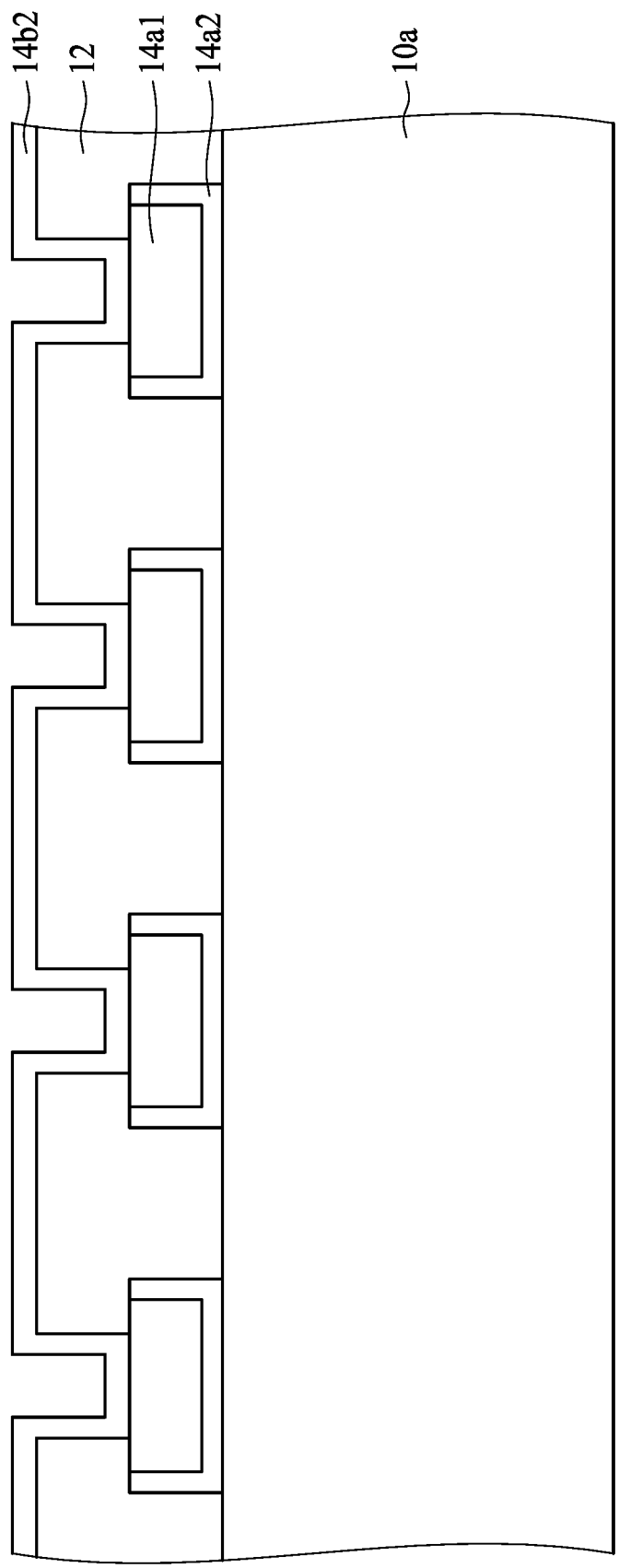

Referring to FIG. 2K, the interconnection layer 14b2 can be formed on the dielectric layer 12 and the disposed portions of the interconnection layer 41a1. The interconnection layers 14b2 can be formed by, for example but is not limited to, sputtering, deposition (e.g. physical vapor deposition (PVD)) or other suitable technique(s).

Figure 2L:
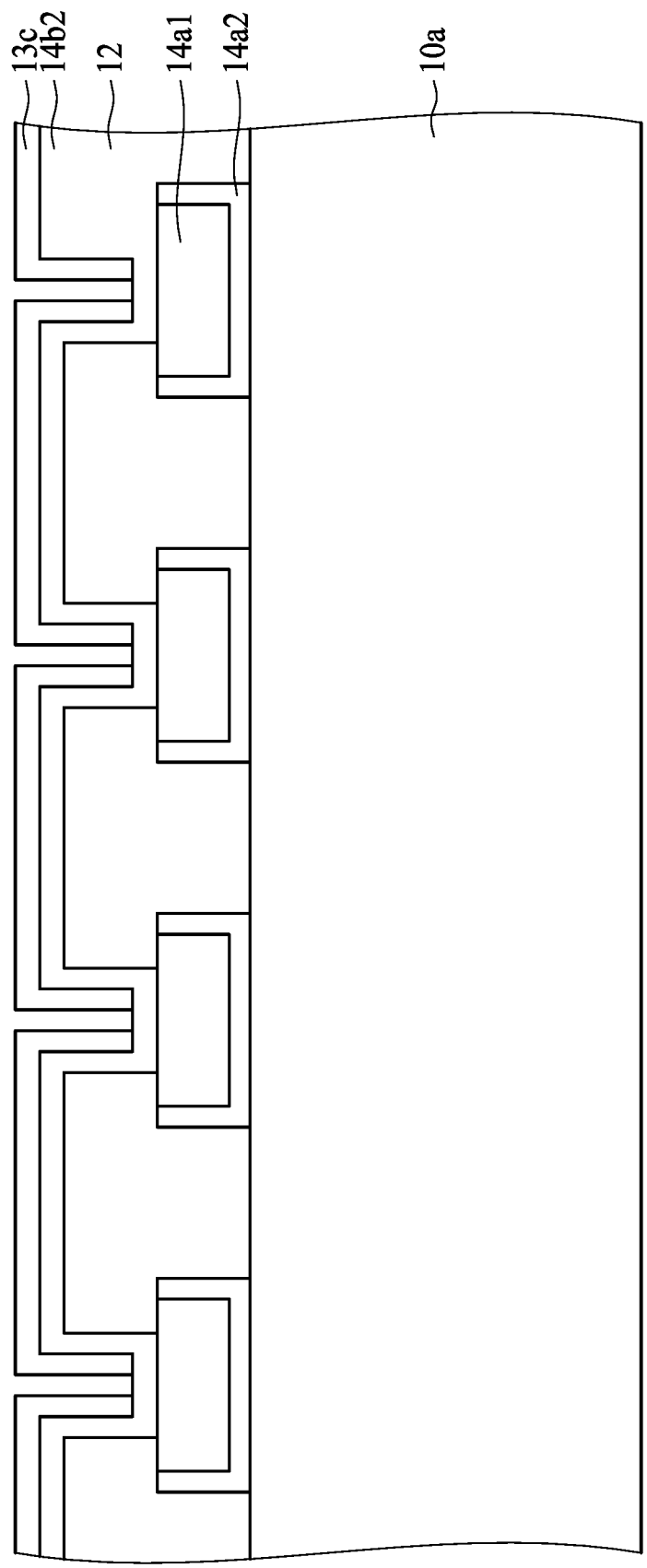

Referring to FIG. 2L, a patterned mask 13c can be formed on the interconnection layer 14b2 to expose the interconnection layer 14b2. The patterned mask (or photomask) 13b can include, for example but is not limited to, photoresist (PR) material or other suitable material(s). The patterned mask 13c can be formed by, for example but is not limited to, photolithography technique (which may involve coating, exposure, developing) or other suitable technique(s).

Figure 2M:
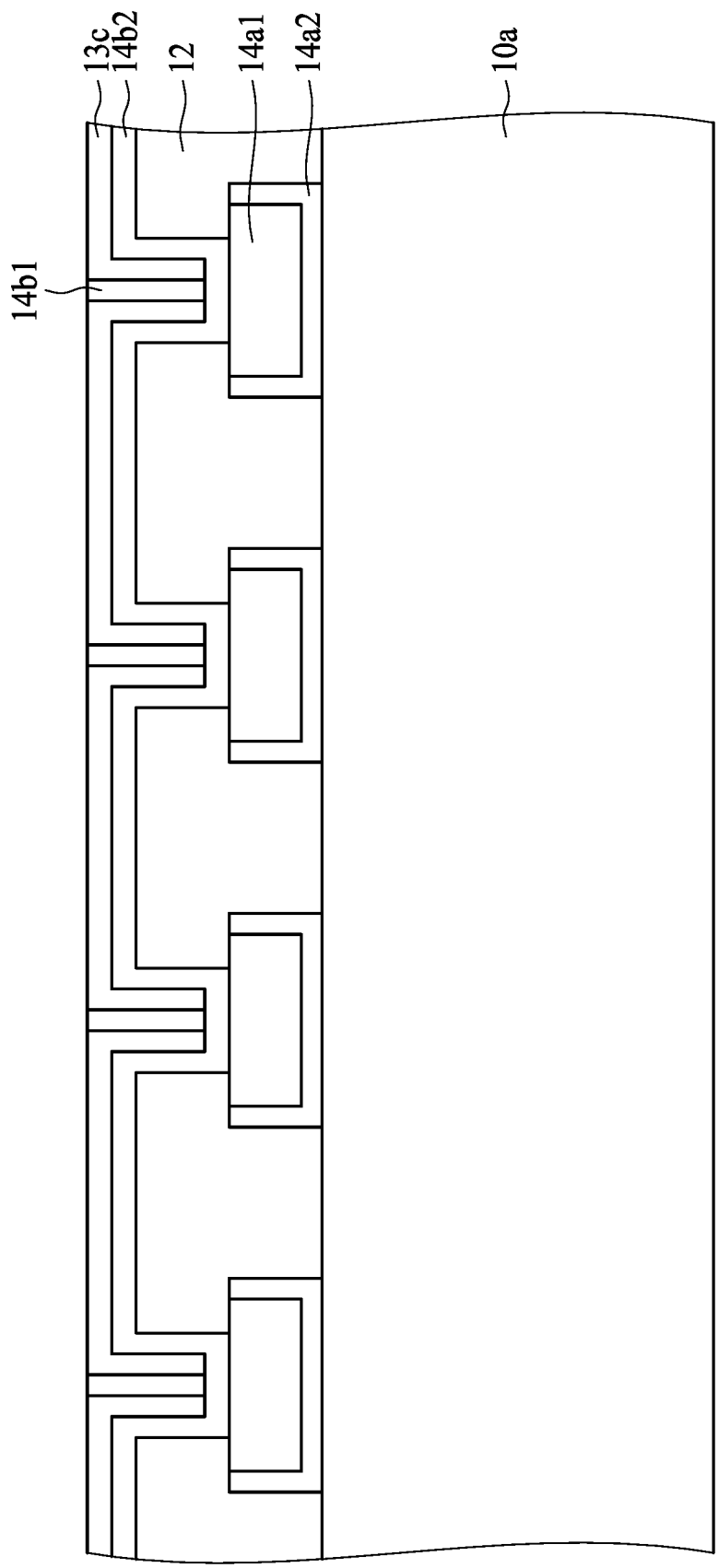

Referring to FIG. 2M, the interconnection layer 14b1 can be formed on the dielectric layer 12 and surrounded by the patterned mask 13c. The interconnection layer 14b1 can be formed by, for example but is not limited to, sputtering, deposition (e.g. physical vapor deposition (PVD)) or other suitable technique(s).

Figure 2N:
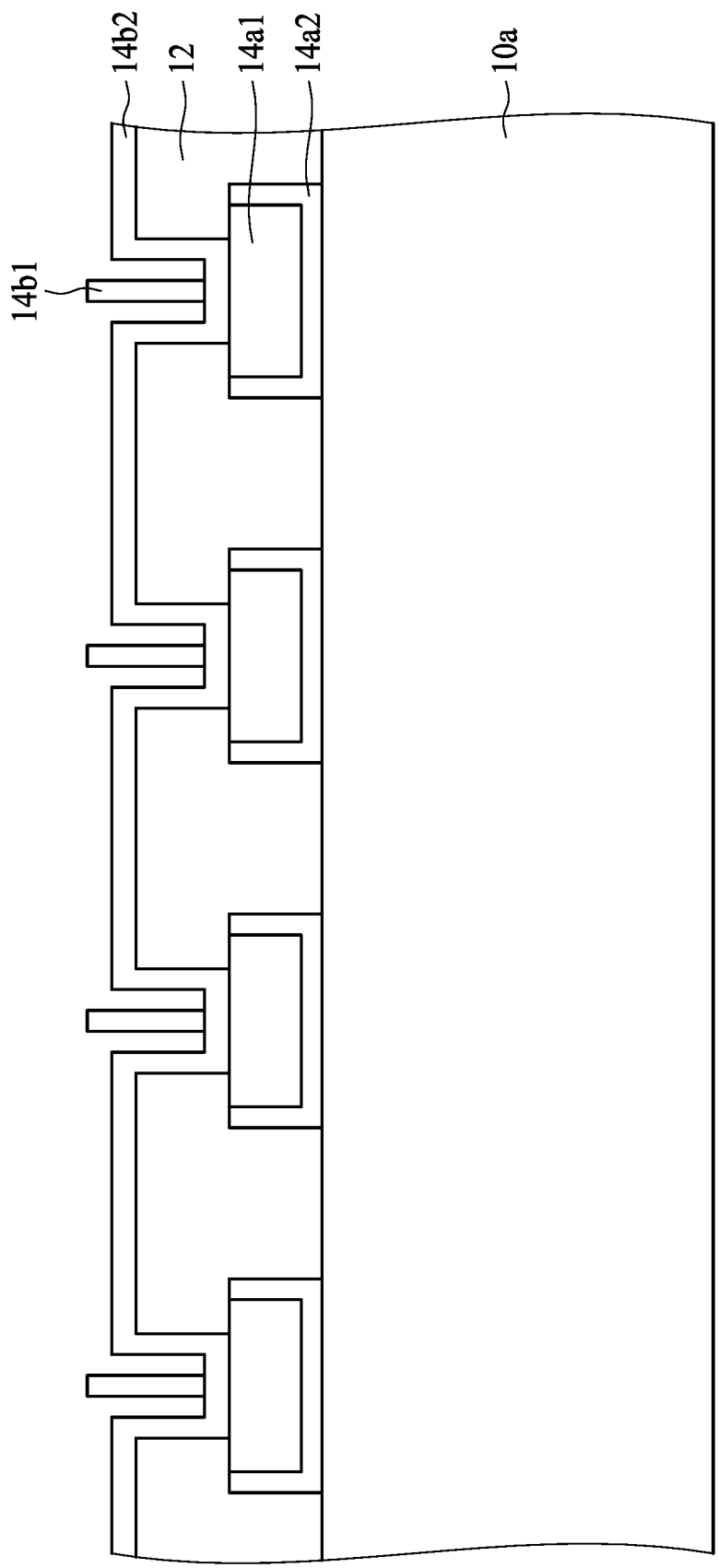

Referring to FIG. 2N, the patterned mask 13c can be removed. The patterned mask 13c can be removed by, for example but is not limited to, striping, etching or other suitable technique(s).

Figure 2O:
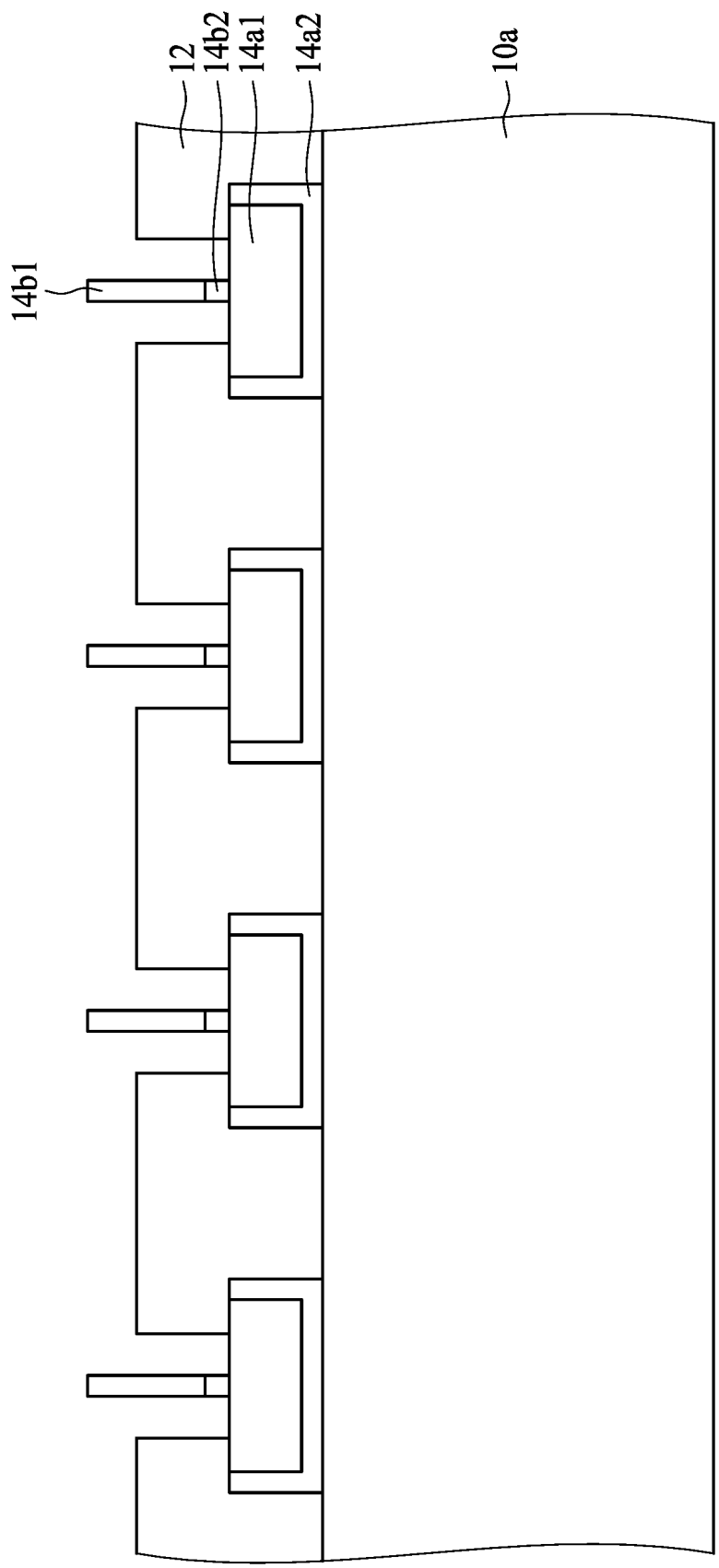

Referring to FIG. 2O, the portions of the interconnection layer 14b2 which are not covered by the interconnection layer 14b1 can be removed. The removing operation can be performed by, for example but is not limited to, etching (e.g. dry etching) technique or other suitable technique(s).

Figure 2P:
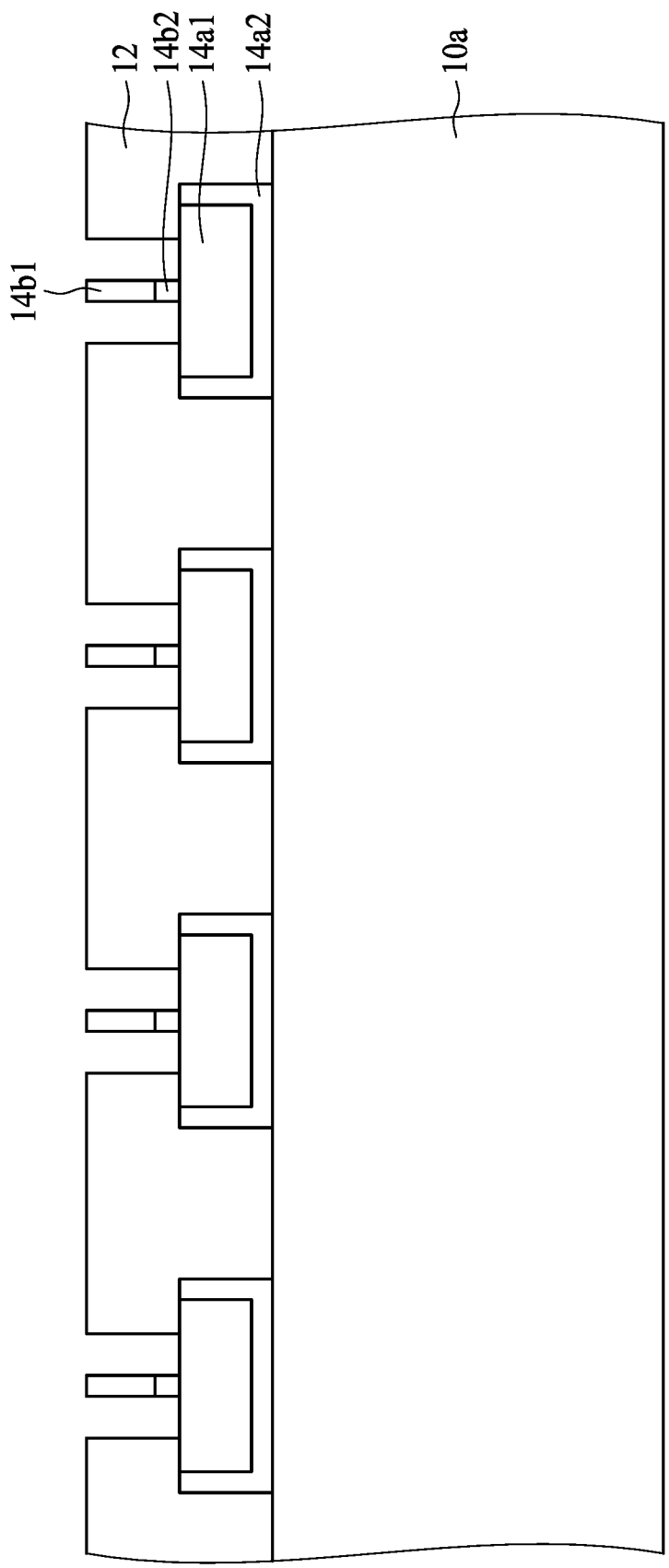

Referring to FIG. 2P, the planarization operation can be performed so that the interconnection layer 14b1 can be substantially coplanar with the dielectric layer 12. The planarization operation can be formed by, for example but is not limited to, chemical mechanical polishing (CMP), grinding, dry polishing, etching or other suitable technique(s).

Figure 3A:
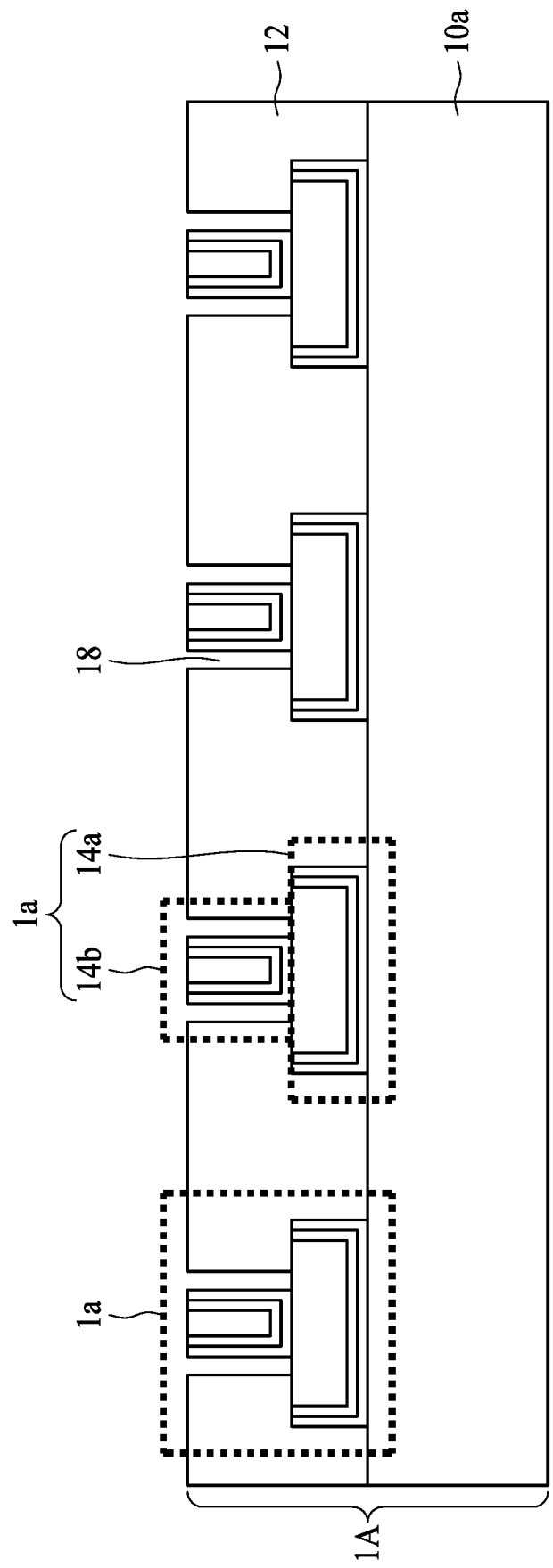
FIG. 3A is a cross-sectional view of another semiconductor device in accordance with some embodiments of the present disclosure.

FIG. 3A is a cross-sectional view of another semiconductor package 1A in accordance with some embodiments of the present disclosure.

Referring to FIG. 3A, the semiconductor device 1A can include, for example but is not limited to, a microcontroller (MCU), a microprocessor (e.g., single or multi-core), a memory device, a memory controller, a chipset, a graphics device, a high bandwidth memory (HBM), or an application-specific integrated circuit (ASIC) according to several different embodiments.

The semiconductor device 1A can include a carrier 10a, some connection structures 1a, and a dielectric layer 12.

The carrier 10a can include semiconductor material, glass or other suitable material(s).

The carrier 10a can include a circuitry (not shown in FIG. 3A) electrically connected to the connection structures 1a. The carrier 10a can include a redistribution layer (RDL) structure (not shown in FIG. 3A) electrically connected to the connection structures 1a. The semiconductor substrate 10a can include conductive pad(s), trace(s) or via(s) (not shown in FIG. 3A) electrically connected to the connection structures 1a.

The connection structures 1a can include conductive material, for example but is not limited to, copper (Cu), gold (Au), aluminum (Al), or other suitable material.

The connection structure 1a can be surrounded by the dielectric layer 12. The connection structure 1a can be enclosed by the dielectric layer 12.

The connection structure 1a can be covered by a dielectric layer 12. The connection structure 1a can be partially covered by a dielectric layer 12.

The connection structure 1a can be embedded within the dielectric layer 12. The connection structures 1a can be separated or spaced apart from one another. A connection structure 1a can be separated from another connection structure 1a by a distance. The connection structures 1a can be separated or spaced apart by the dielectric layer 12.

The connection structure 1a can include two portions 14a and 14b. The portion 14a may be formed or disposed on the carrier 10a. The portion 14b may be formed or disposed on the portion 14a. The portions 14a and 14b can have different widths. The portion 14a can have a width greater than the portion 14b.

The portion 14a can include an upper surface (not denoted in FIG. 3A), a lower surface (not denoted in FIG. 3A) and a lateral surface (not denoted in FIG. 3A) extended between the upper surface and the lower surface. The lower surface of the portion 14a can be in direct contact with the carrier 10a. The lateral surface of the portion 14a can be in direct contact with the dielectric layer 12. The upper surface of the portion 14a can be in direct contact with the portion 14b.

The upper surface of the portion 14a can be exposed. The upper surface of the portion 14a can be in direct contact with the dielectric layer 12.

The portion 14b can include an upper surface (not denoted in FIG. 3A), a lower surface (not denoted in FIG. 3A) and a lateral surface (not denoted in FIG. 3A) extended between the upper surface and the lower surface. The lower surface of the portion 14b can be in direct contact with the portion 14a. The lateral surface of the portion 14b can be separated or spaced apart from the dielectric layer 12 by a space 18. The lateral surface of the portion 14b can be exposed. The lateral surface of the portion 14b can be exposed to the space 18.

Figure 3B:
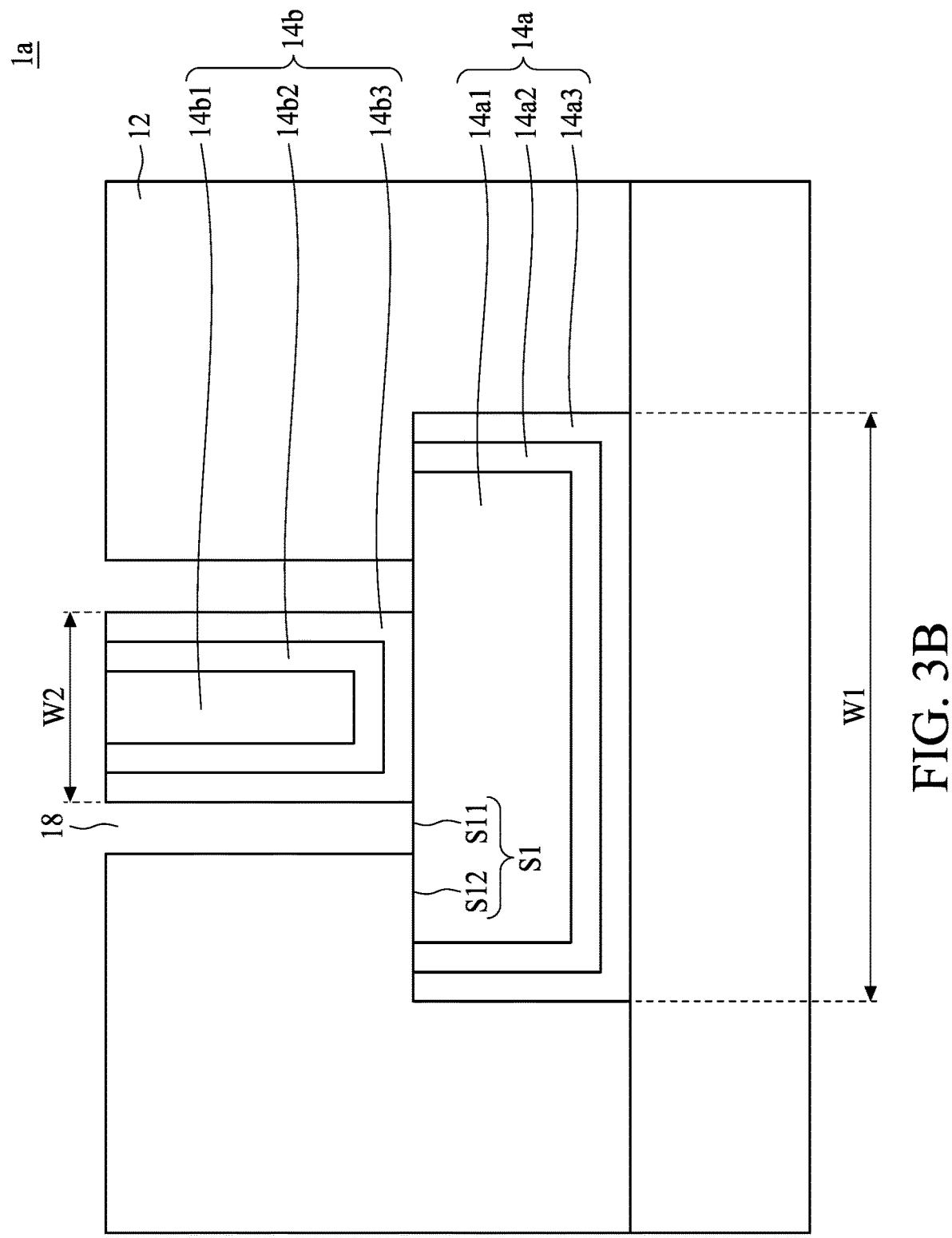
FIG. 3B is an enlarged view of the connection structure as shown in FIG. 3A.

FIG. 3B is an enlarged view of the connection structure 1a as shown in FIG. 3A.

Referring to FIG. 3B, the connection structure 1a can include two portions 14a and 14b. The portion 14a has a width W1, and the portion 14b has a width W2. The width W1 can be larger than the width W2.

The portion 14a can include some interconnection layers 14a1, 14a2 and 14a3.

The portion 14b can include some interconnection layers 14b1, 14b2 and 14b3.

Each of the interconnection layers 14a1, 14a2, 14a3, 14b1, 14b2 and 14b3 may include, for example but is not limited to, aluminum (Al), copper (Cu), titanium (Ti), tungsten (W) or other suitable material(s) (e.g. metal, alloy or non-metal conductive material(s)).

The interconnection layer 14a1 can have a rectangle or a rectangle-like profile. The interconnection layer 14a1 can have a round or a round-like profile.

The interconnection layer 14a1 can be exposed to the space 18. The interconnection layer 14a1 can be exposed to the air in the space 18. The interconnection layer 14a1 can be covered by the dielectric layer 12. The interconnection layer 14a1 can be in direct contact with the dielectric layer 12.

The interconnection layer 14a2 can have a U shape or a U shape-like structure. The interconnection layer 14a2 can include a cup or cup-like structure. The interconnection layer 14a2 can surround the interconnection layer 14a1. The interconnection layer 14a2 can enclose the interconnection layer 14a1. The interconnection layer 14a2 can be in direct contact with the interconnection layer 14a1. The interconnection layer 14a2 can be in direct contact with the dielectric layer 12. The interconnection layer 14a2 can be covered by the dielectric layer 12. The interconnection layer 14a2 can be disposed between the interconnection layer 14a1 and the interconnection layer 14a3.

The interconnection layer 14a3 can have a U shape or a U shape-like structure. The interconnection layer 14a3 can include a cup or cup-like structure. The interconnection layer 14a3 can surround the interconnection layer 14a1. The interconnection layer 14a3 can surround the interconnection layer 14a2. The interconnection layer 14a3 can enclose the interconnection layer 14a1. The interconnection layer 14a3 can enclose the interconnection layer 14a2. The interconnection layer 14a3 can be in direct contact with the interconnection layer 14a2. The interconnection layer 14a3 can be in direct contact with the dielectric layer 12. The interconnection layer 14a3 can be in direct contact with the carrier 10a. The interconnection layer 14a3 can be covered by the dielectric layer 12. The interconnection layer 14a3 can be disposed between the interconnection layer 14a2 and the dielectric layer 12.

A portion S11 of the upper surface S1 of the interconnection layer 14a1 can be exposed by the dielectric layer 12. The portion S11 of the upper surface S1 of the interconnection layer 14a1 can be exposed to the space 18. A portion S12 of the upper surface S1 of the interconnection layer 14a1 can be covered by the dielectric layer 12. The portion S12 of the upper surface S1 of the interconnection layer 14a1 can be in direct contact with the dielectric layer 12.

The interconnection layer 14b1 can have a rectangle or a rectangle-like profile. The interconnection layer 14b1 can have a round or a round-like profile.

The interconnection layer 14b2 can have a U shape or a U shape-like structure. The interconnection layer 14b2 can include a cup or cup-like structure. The interconnection layer 14b2 can surround the interconnection layer 14b1. The interconnection layer 14b2 can enclose the interconnection layer 14b1. The interconnection layer 14b2 can be in direct contact with the interconnection layer 14b1. The interconnection layer 14b2 can be in direct contact with the interconnection layer 14b1. The interconnection layer 14b2 can be disposed between the interconnection layer 14b1 and the interconnection layer 14b3.

The interconnection layer 14b3 can have a U shape or a U shape-like structure. The interconnection layer 14b3 can include a cup or cup-like structure. The interconnection layer 14b3 can surround the interconnection layer 14b1. The interconnection layer 14b3 can surround the interconnection layer 14b2. The interconnection layer 14b3 can enclose the interconnection layer 14b1. The interconnection layer 14b3 can enclose the interconnection layer 14b2. The interconnection layer 14b3 can be in direct contact with the interconnection layer 14b2. The interconnection layer 14b3 can be disposed between the interconnection layer 14b2 and the space 18.

A lateral surface of the interconnection layer 14b3 can be exposed to the space 18. The space 18 can be vacuum. There can be air in the space 18. The lateral surface of the interconnection layer 14b3 can be in direct contact with the air in space 18. The space 18 can be defined or surrounded by the portion S11 of the upper surface S1 of the interconnection layer 14a1, the lateral surface of the interconnection layer 14b3, and the lateral surface of the dielectric layer 12. A boundary of the space 18 can be formed or defined by the portion S11 of the upper surface S1 of the interconnection layer 14a1, the lateral surface of the interconnection layer 14b3, and the lateral surface of the dielectric layer 12.

Figure 3C:
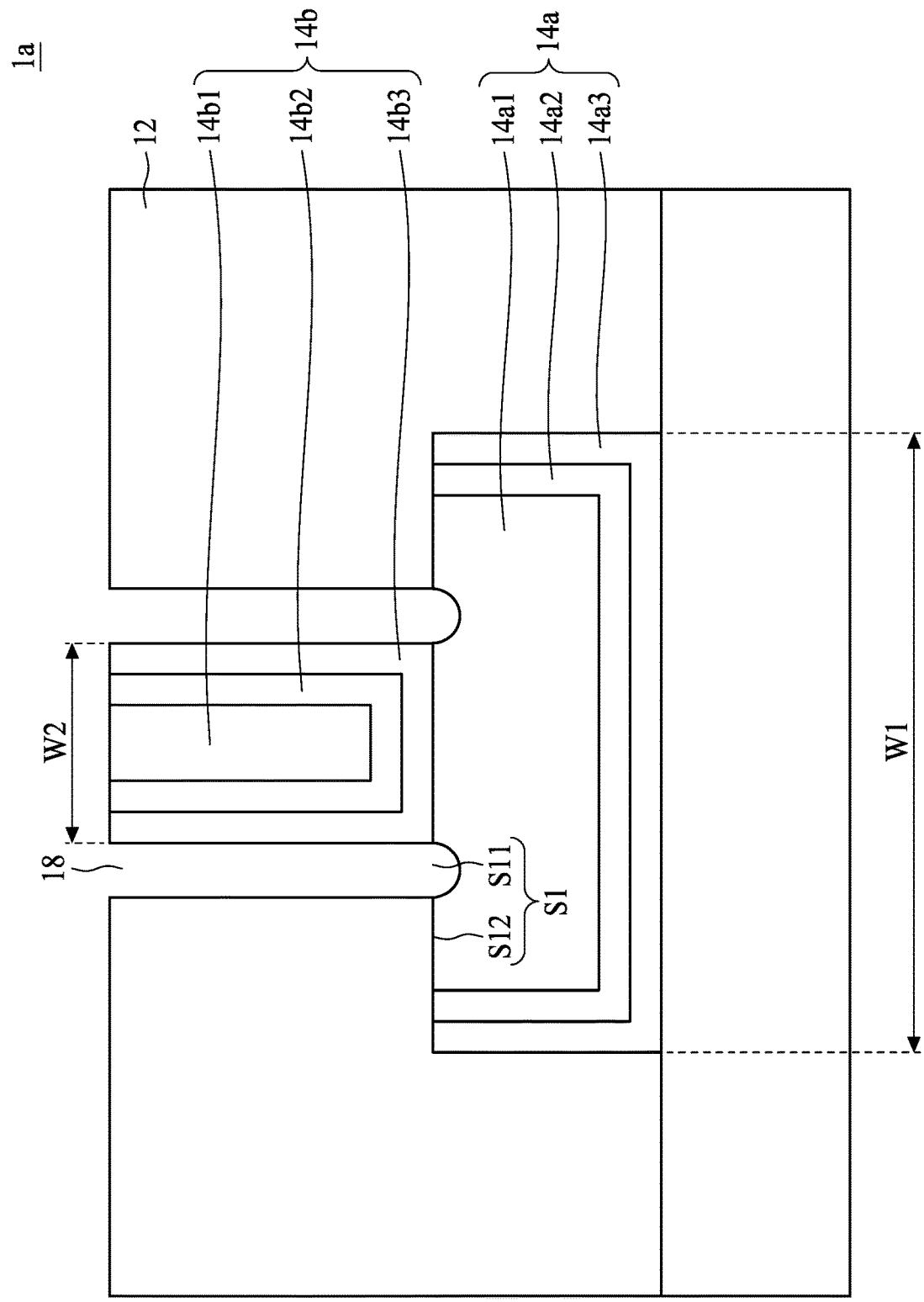
FIG. 3C is an enlarged view of the connection structure as shown in FIG. 3A.

FIG. 3C is an enlarged view of the connection structure 1a as shown in FIG. 3A. Referring to FIG. 3C, the connection structure 1a is similar to the connection structure 1a as illustrated and described with reference to FIG. 3B, except that the portion S11 of the upper surface S1 of the interconnection layer 14a1 is uneven or rugged due to over-etching by an etching (e.g. dry etching) technique or other suitable technique(s).

Figure 3D:
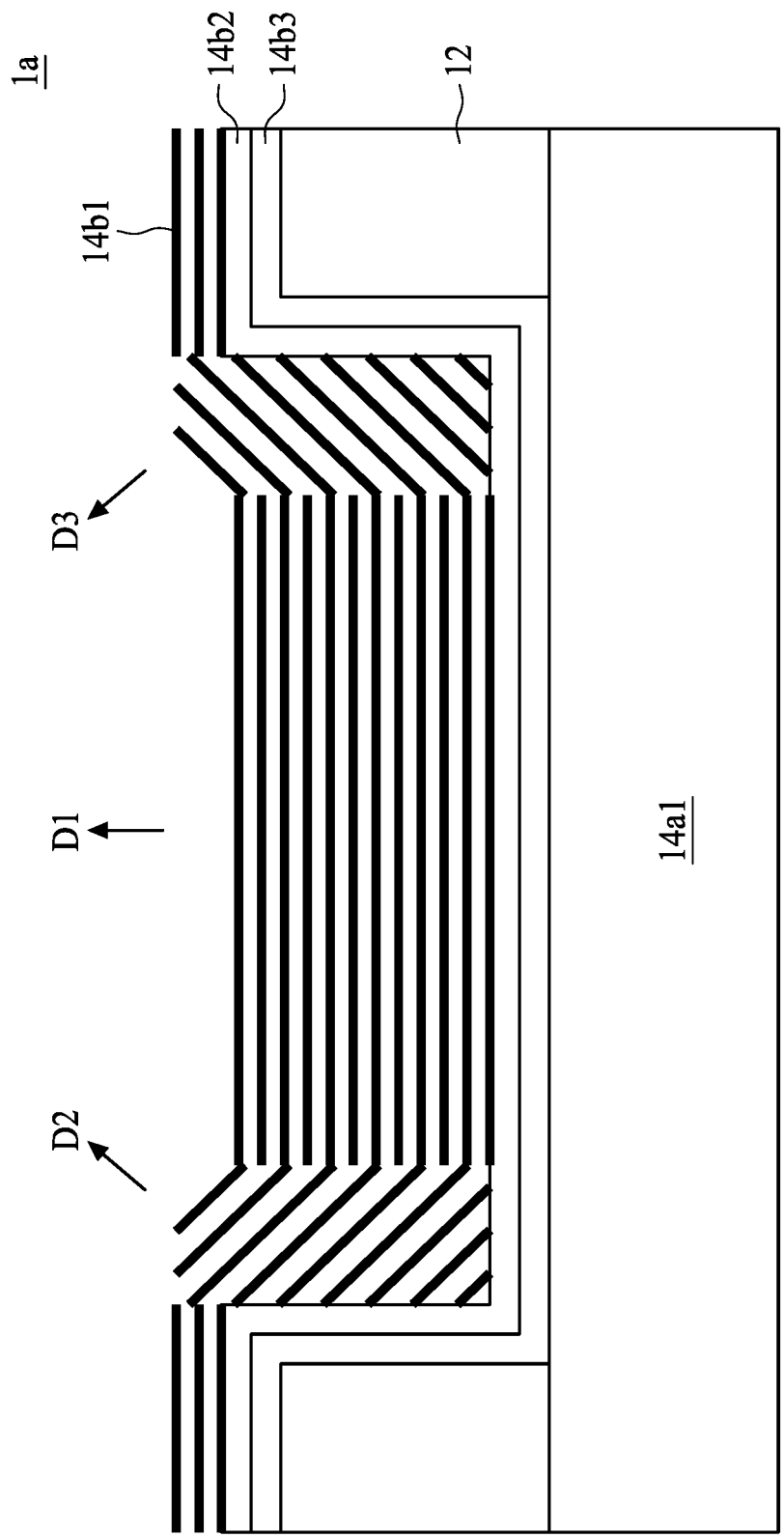
FIG. 3D illustrates lattice direction of the connection structure as shown in FIG. 3C.

Referring to FIG. 3D, the connection structure 1a is similar to the connection structure 1a as illustrated and described with reference to FIG. 3C, except that a lattice of the interconnection layer 14b1 can be further illustrated. Referring to FIG. 3D, the interconnection layer 14b1 can have a crystal structure. The interconnection layer 14b1 can have a crystallographic direction or lattice direction as denoted by an arrow D1. The crystallographic direction or lattice direction D1 can include a direction of (111) (Miller indices). The lattice of the interconnection layer 14b1 can extend toward at least two different directions from the interconnection layer 14b2. The lattice of the interconnection layer 14b1 can extend along several directions D1, D2 and D3.

Figure 3E:
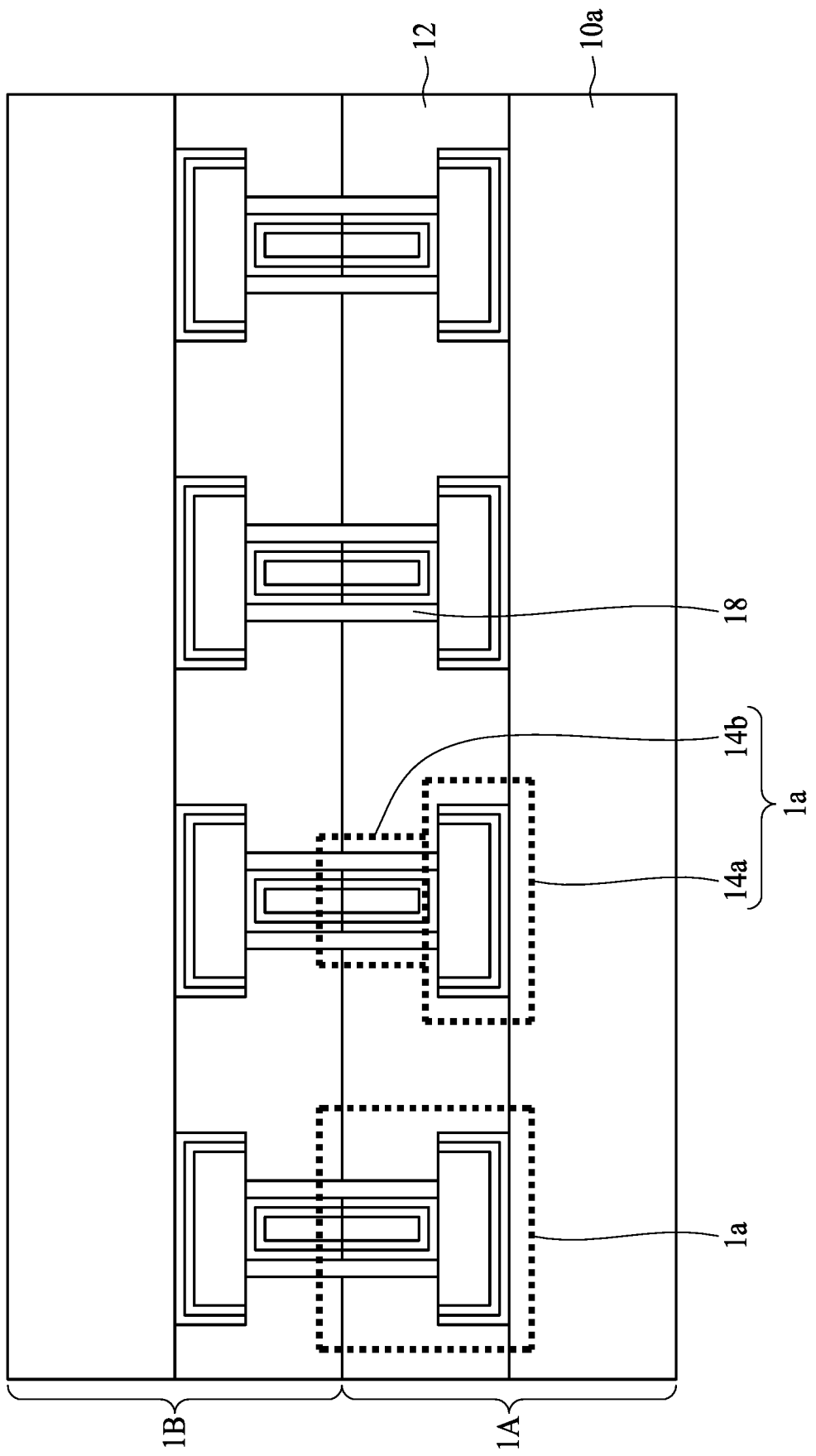
FIG. 3E is a cross-sectional view of another semiconductor device package in accordance with some embodiments of the present disclosure.

FIG. 3E is a cross-sectional view of a semiconductor device package 1 in accordance with some embodiments of the present disclosure. The semiconductor device package 1 can include two semiconductor devices 1A and 1B. The banding pair 1A can include a plurality of connection structures 1a on the carrier 10a. The banding pair 1B can include a plurality of connection structures 1b on the carrier 10b.

Hybrid bonding technique can be used to form a semiconductor device package 1. Hybrid bonding can refer to bonding that involves two or more materials (e.g. metal-to-metal bonding and dielectric-to-dielectric bonding). The interconnection layer of the portion 1a can be bonded to the interconnection layer of the portion 1b. The dielectric layer of the portion 1a can be bonded to the dielectric layer of the portion 1b.

However, coefficient of thermal expansion (CTE) mismatch of two or more materials during or subsequent to thermal cycle(s) may result in delamination issue (e.g. delamination occurs on the interface of two dielectric layers), which adversely affect reliability or performance of the semiconductor device package 1.

When CTE mismatch occurs, the space 18 can be used as a trench or buffer. The contact surface of the materials will not be damaged or degraded due to the CTE mismatch. Therefore, during the thermal cycle(s), the semiconductor device package 1 can be prevented from delamination by arranging the space 18 between the interconnection layer and the dielectric layer.

During the thermal cycle(s), compression stress CS can be generated from the portions 14a and 14b respectively due to the thermal expansion. Another tensile stress TS can be generated from the dielectric layer corresponding to the above compression stress CS. The portion 14a can have a width greater than the portion 14b. The upper surface and the lateral surface of the portion 14a directly contacts the dielectric layer 12. Therefore, a portion of the tensile stress TS can be countervailed or compensated by the compression stress CS of the portion 14a. Therefore, the delamination or degradation can be further reduced.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O and FIG. 4P illustrate various stages of a method for manufacturing a semiconductor device package 1 accordance with some embodiments of the subject application. FIG. 4A to FIG. 4K are similar to those as illustrated and described with reference to FIG. 2A to FIG. 2K, and will not be further illustrated again.

Figure 4A:
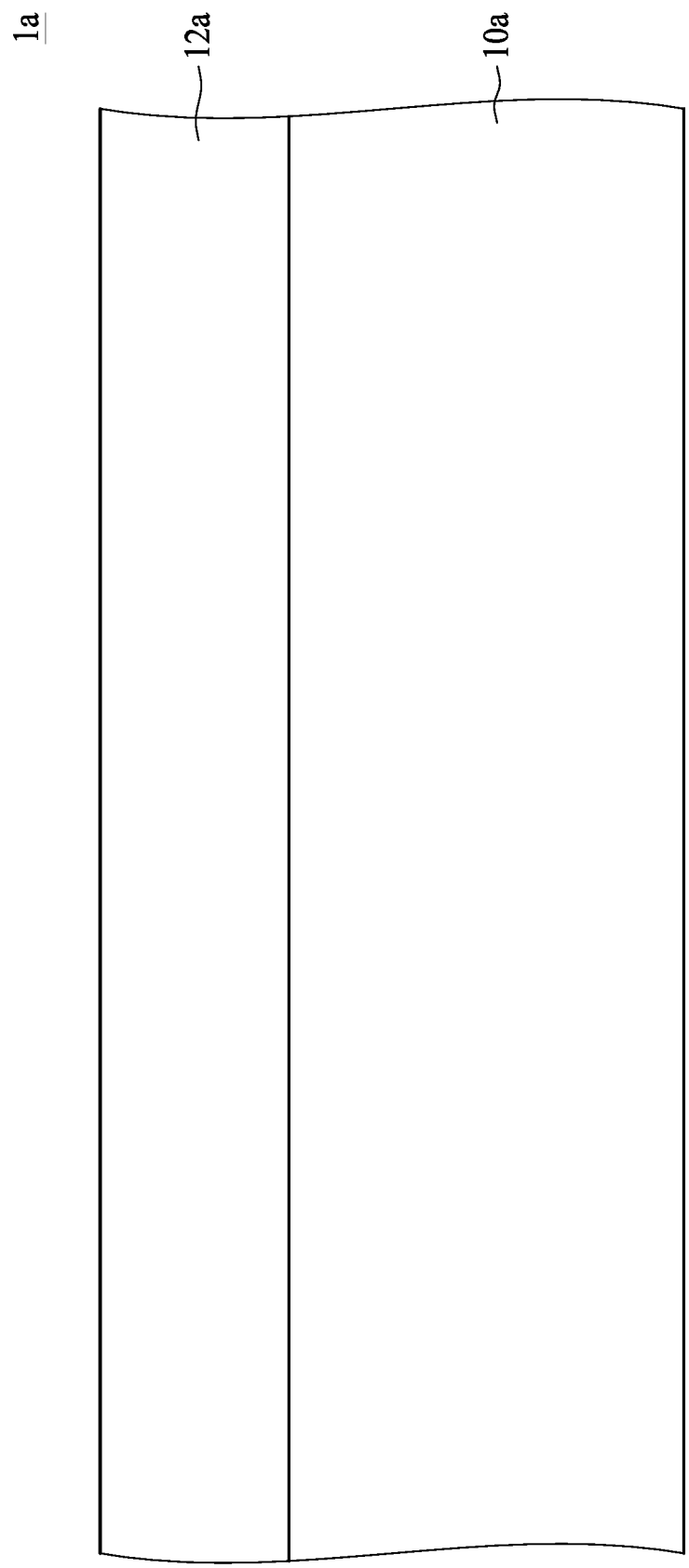
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O and FIG. 4P illustrate various stages of a method for manufacturing a semiconductor device package accordance with some embodiments of the subject application.
Figure 4B:
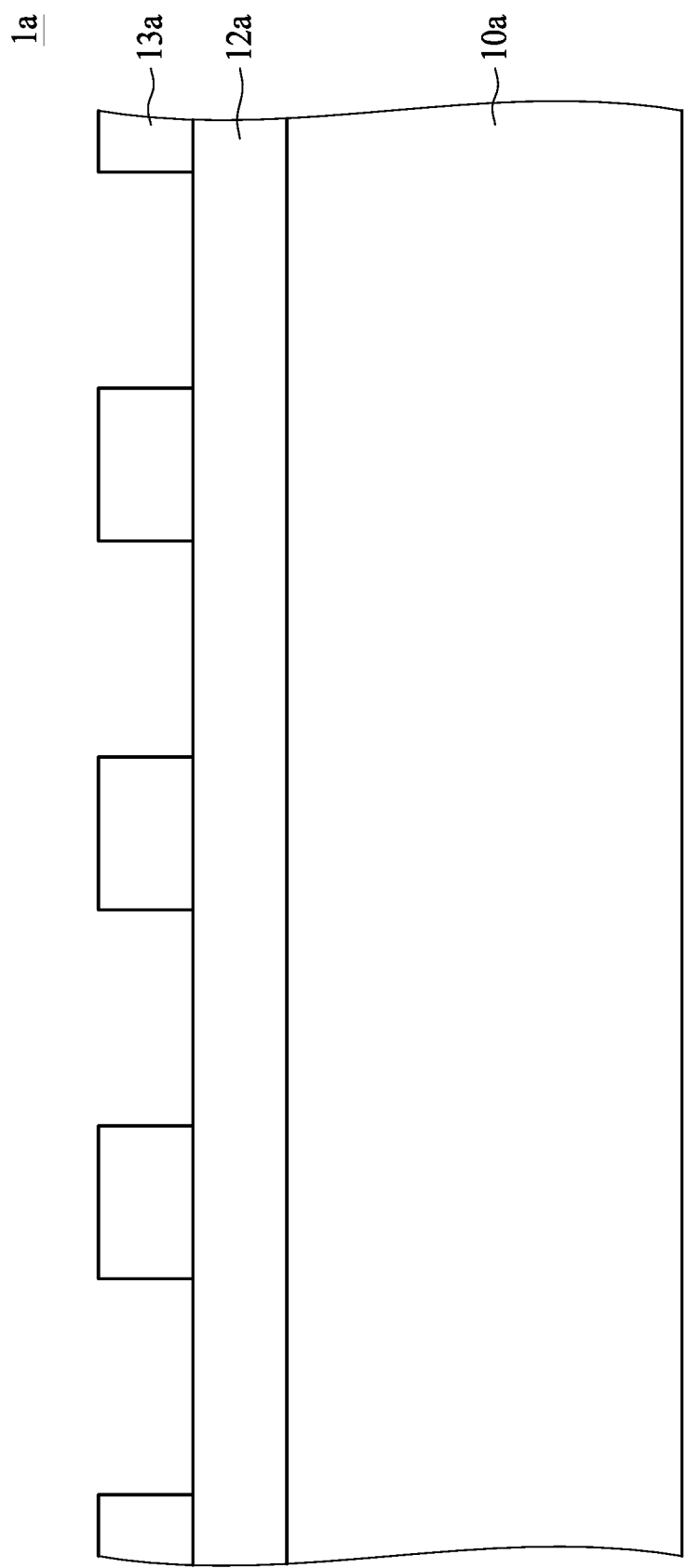
Figure 4C:
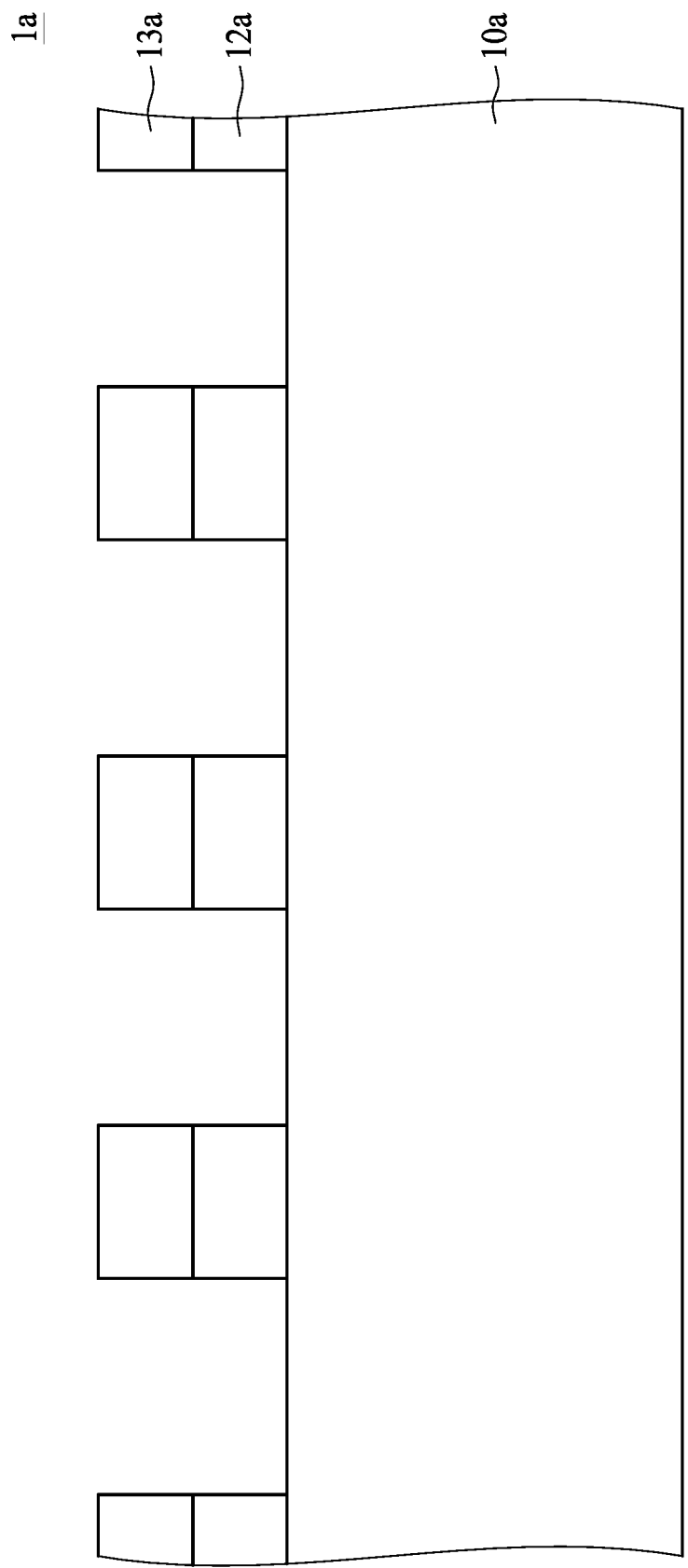
Figure 4D:
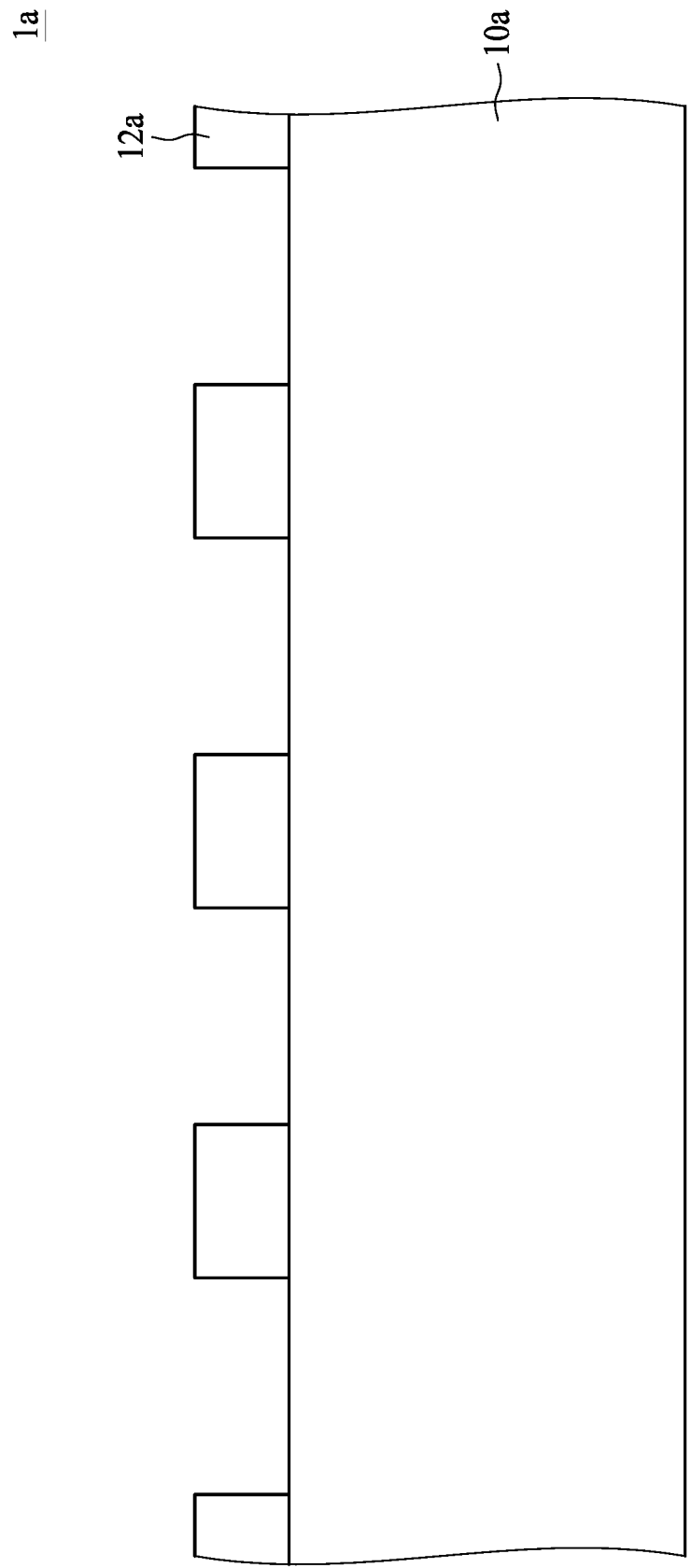
Figure 4E:
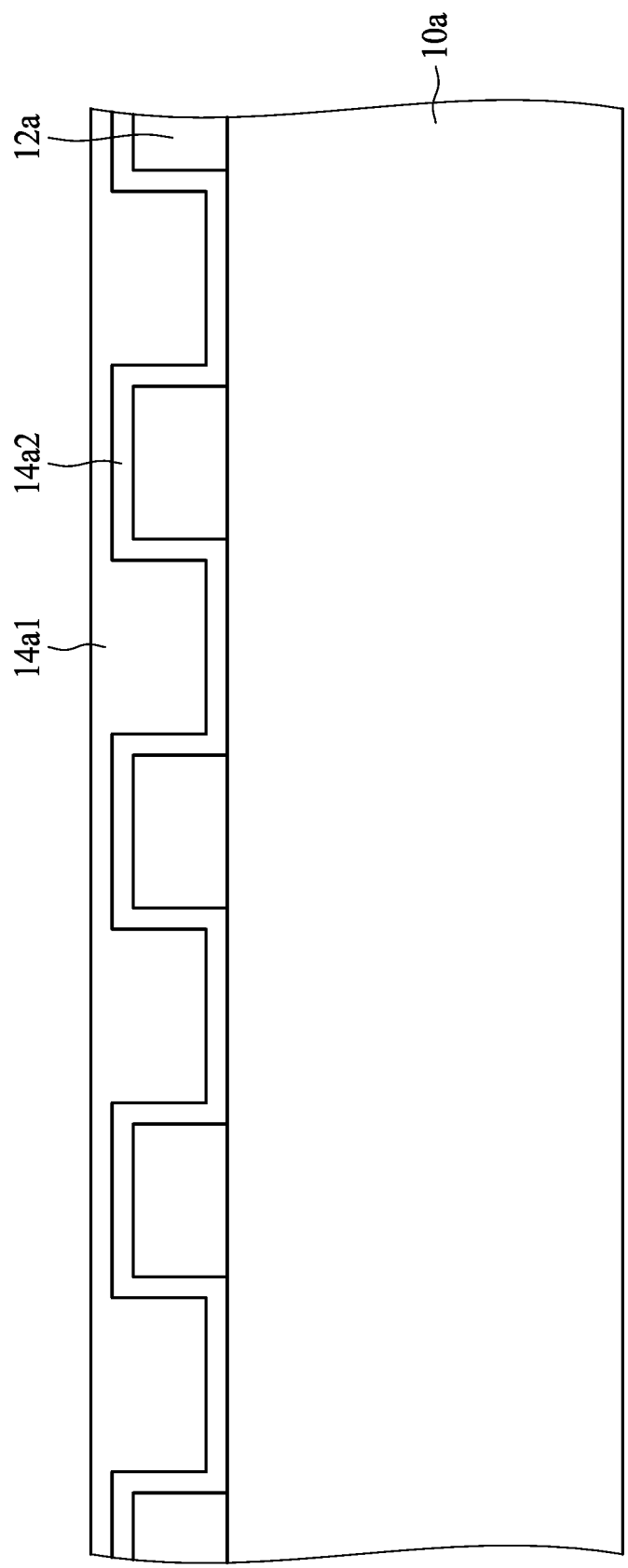
Figure 4F:
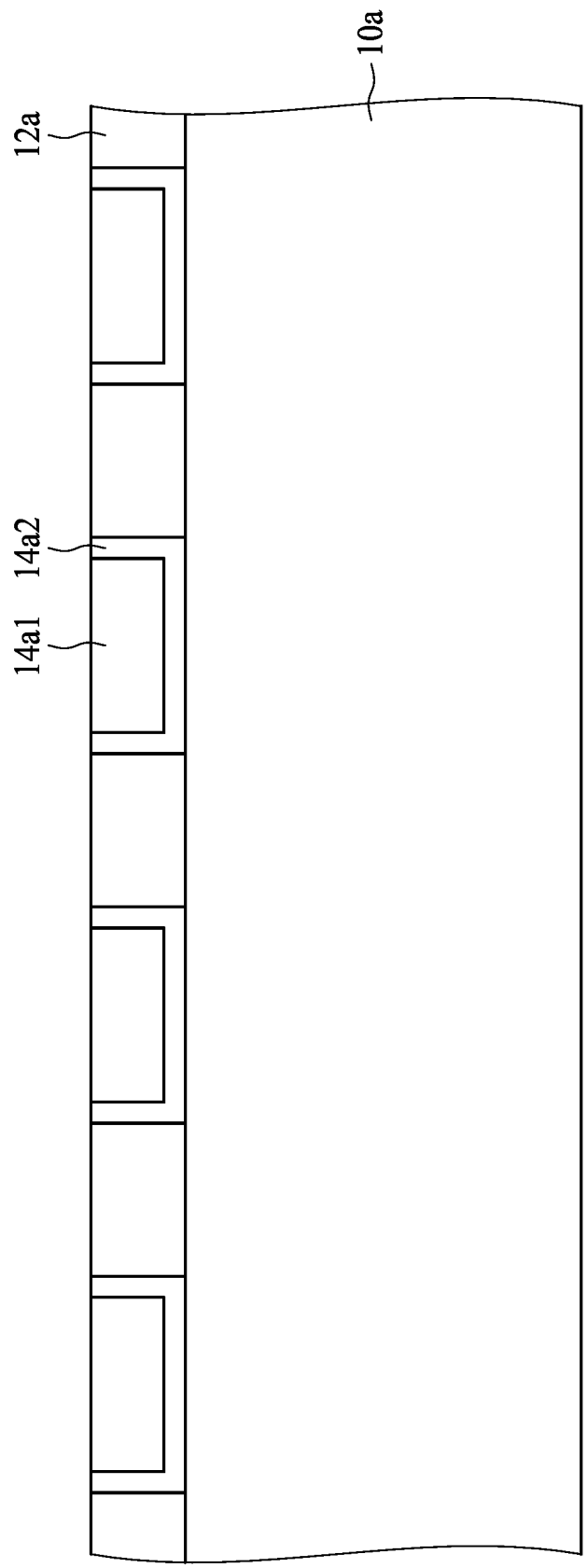
Figure 4G:
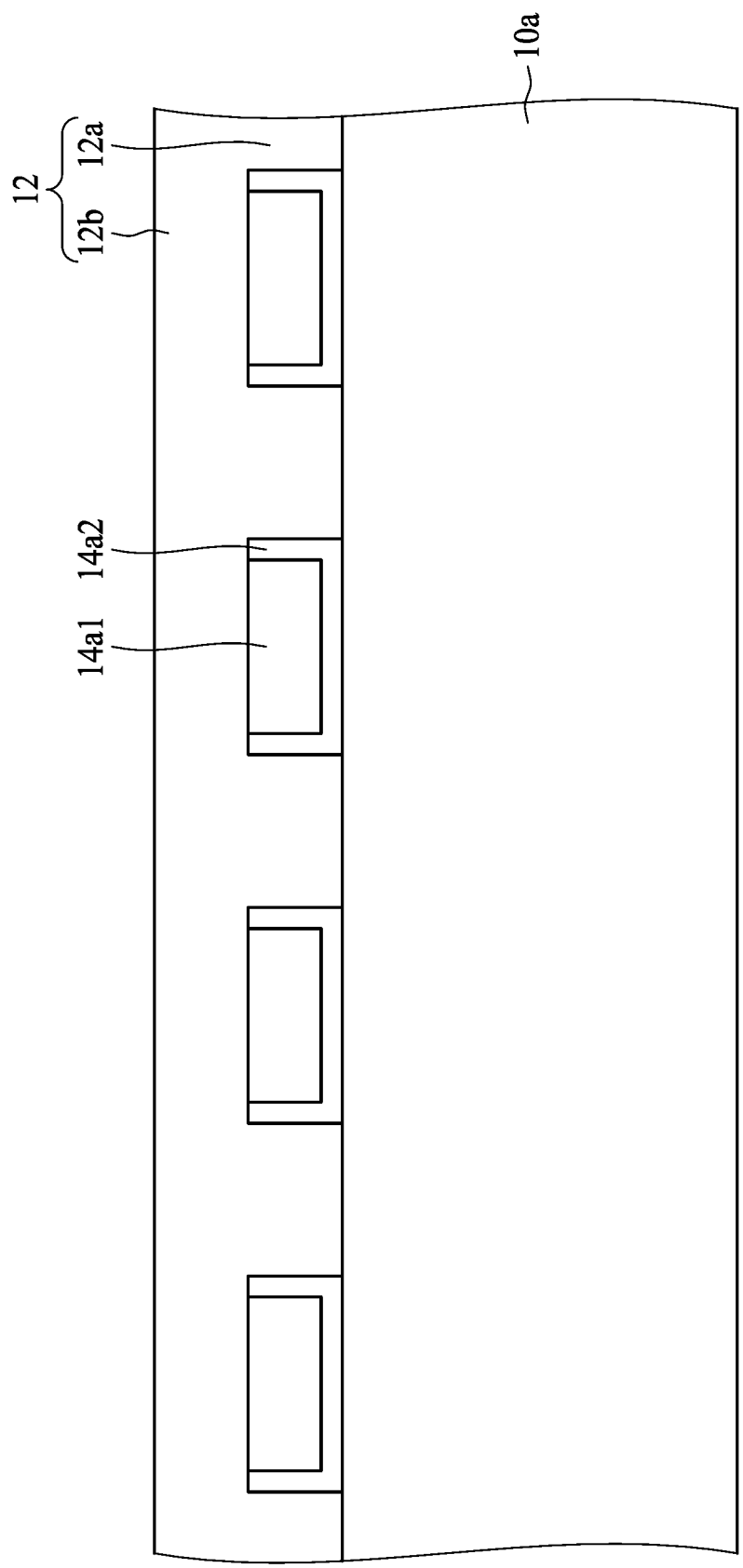
Figure 4H:
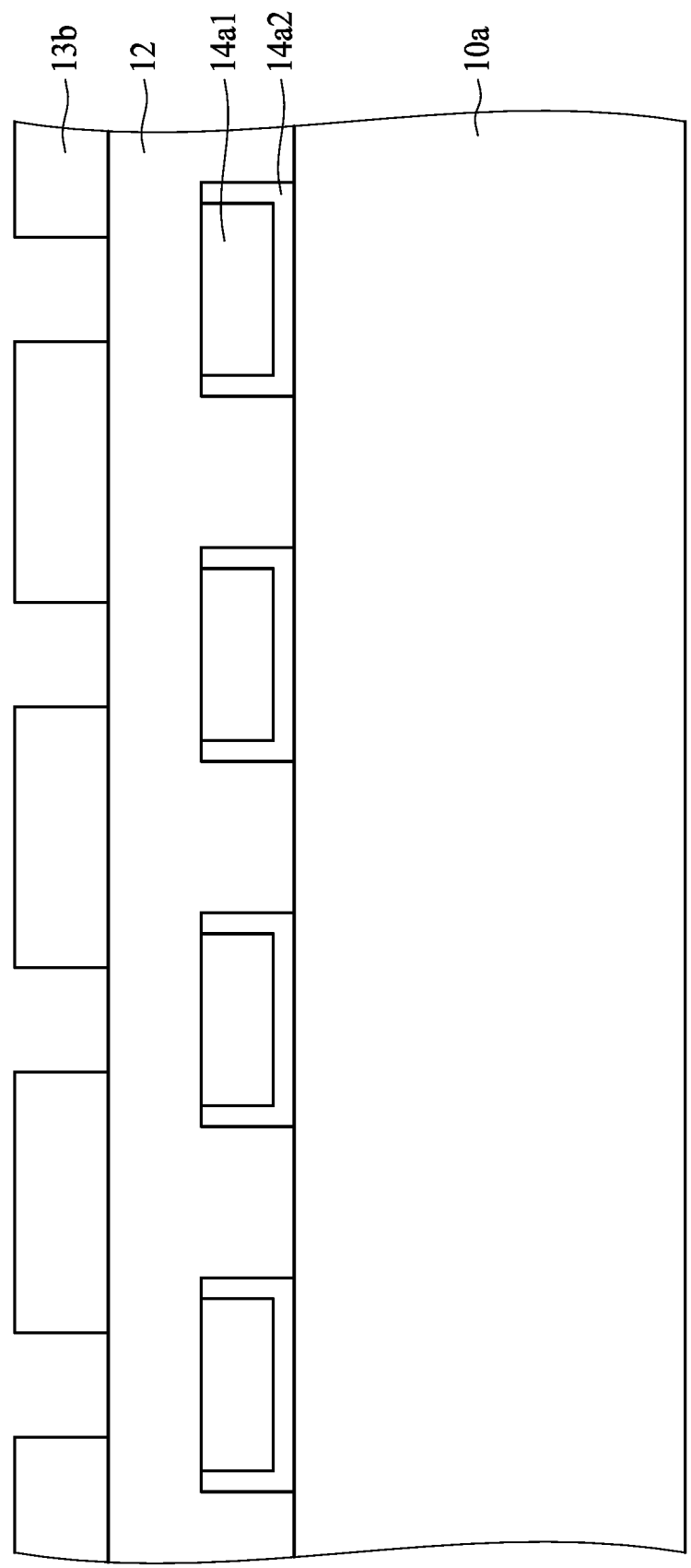
Figure 4I:
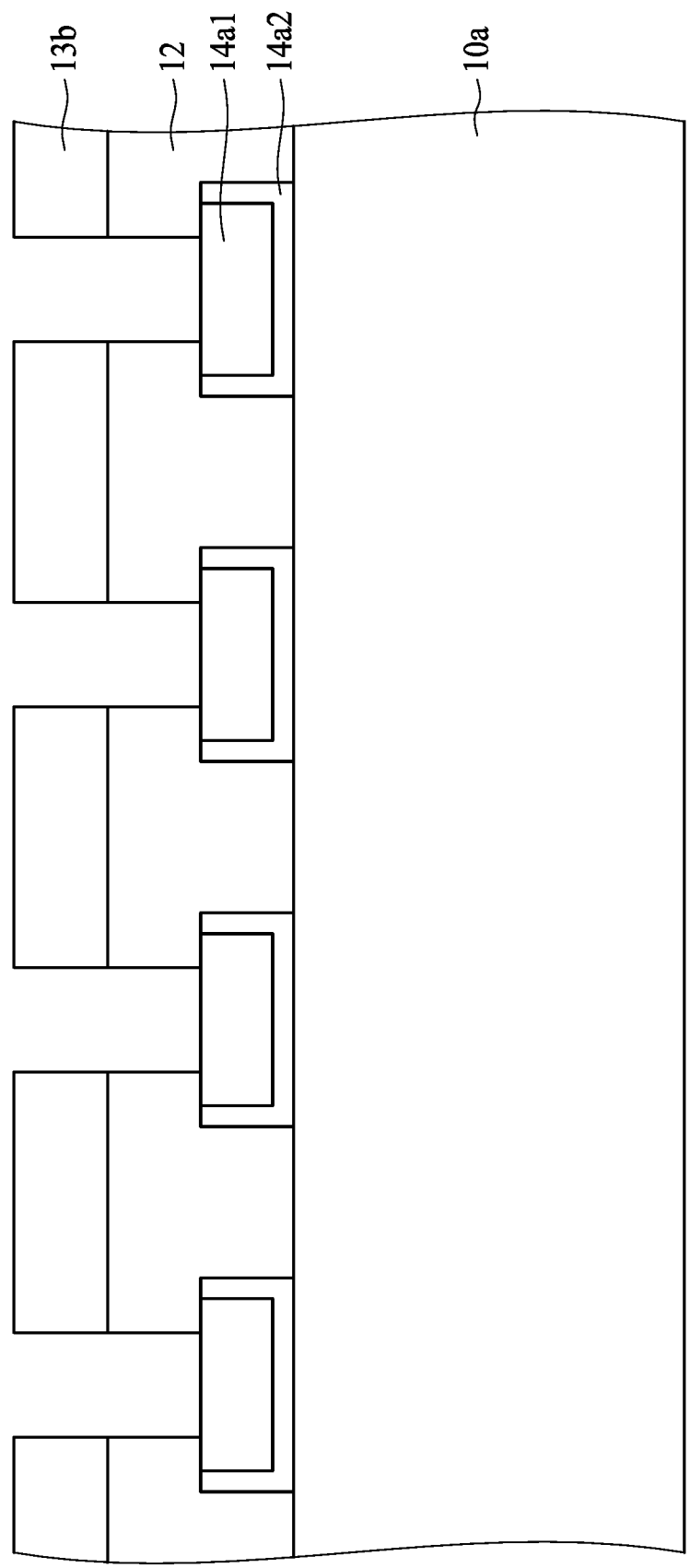
Figure 4J:
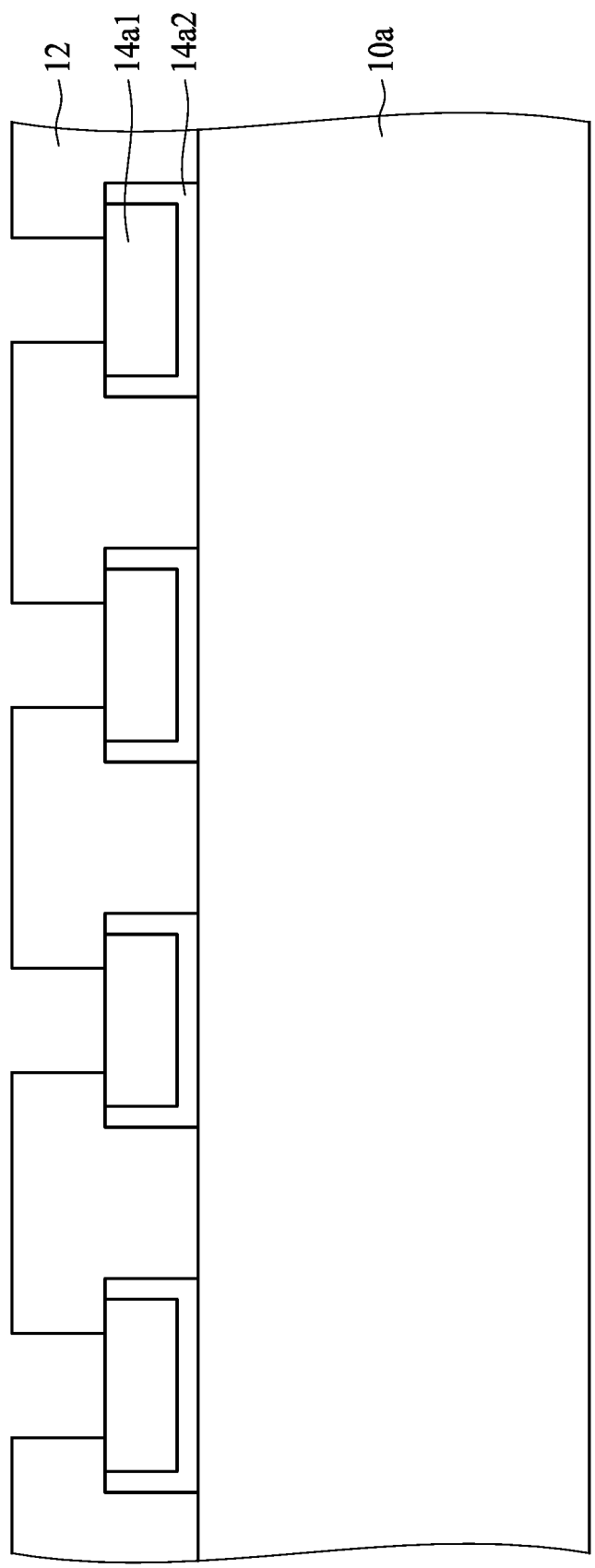
Figure 4K:
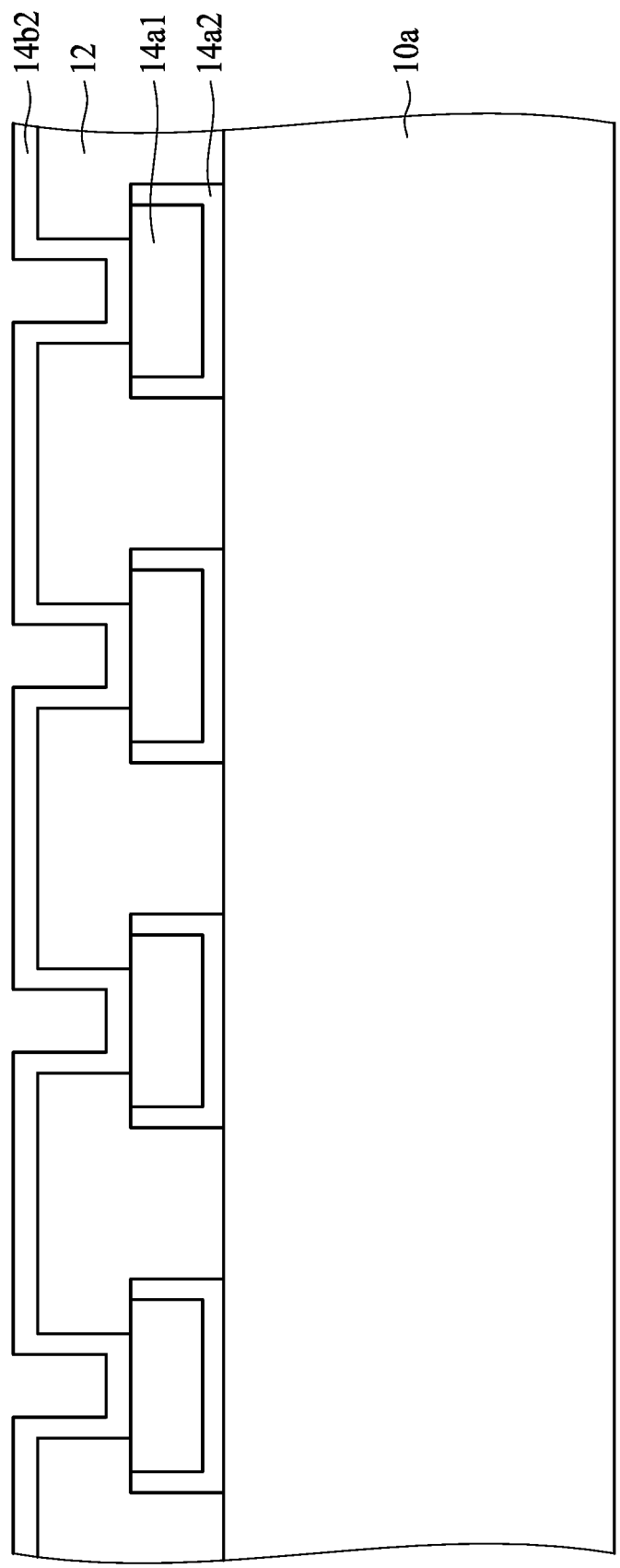

Referring to FIG. 4K, the interconnection layer 14b2 can be formed or deposited accordingly. The interconnection layer 14b2 can be formed by, for example but is not limited to, sputtering, deposition (e.g. physical vapor deposition (PVD)) or other suitable technique(s).

Figure 4L:
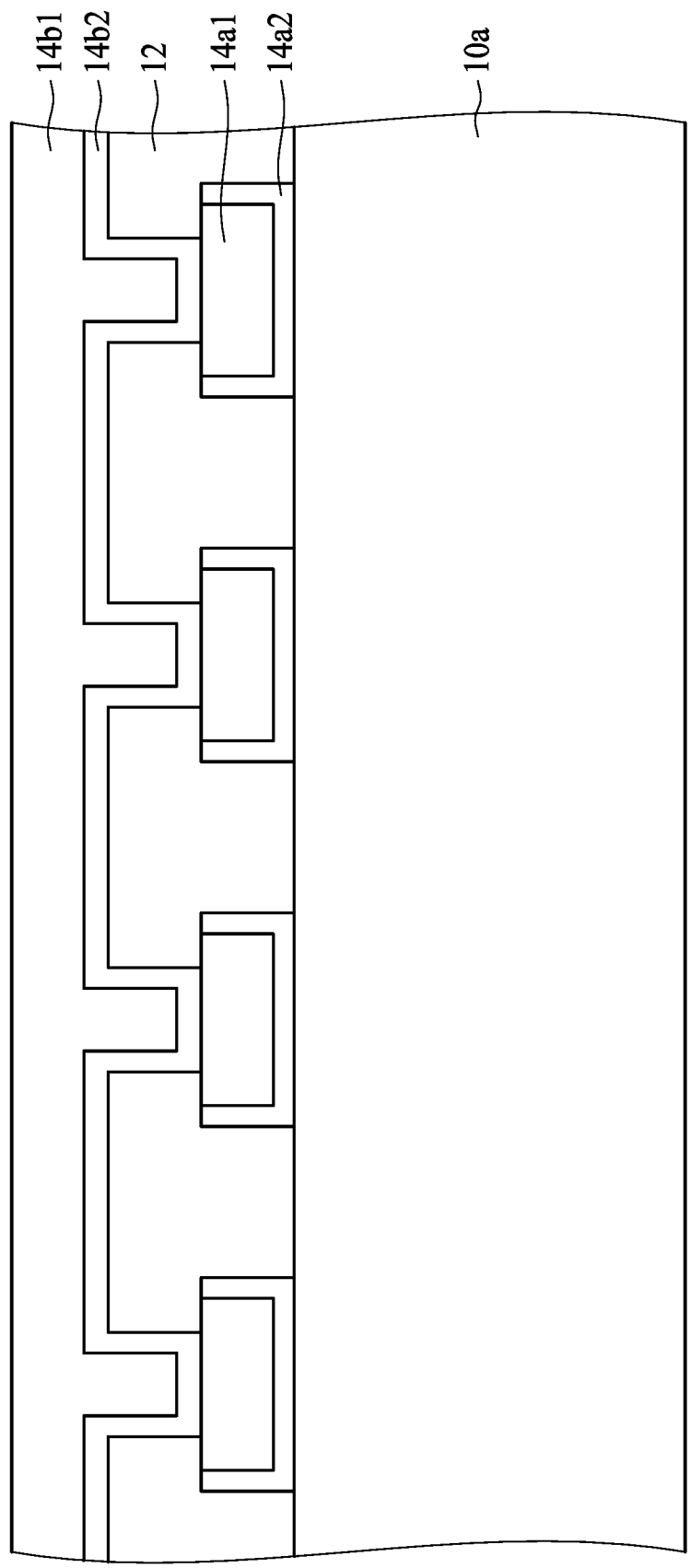

Referring to FIG. 4L, the interconnection layer 14b1 can be formed on the interconnection layer 14b2. The interconnection layers 14b1 can be formed by, for example but is not limited to, sputtering, deposition (e.g. physical vapor deposition (PVD)) or other suitable technique(s).

Figure 4M:
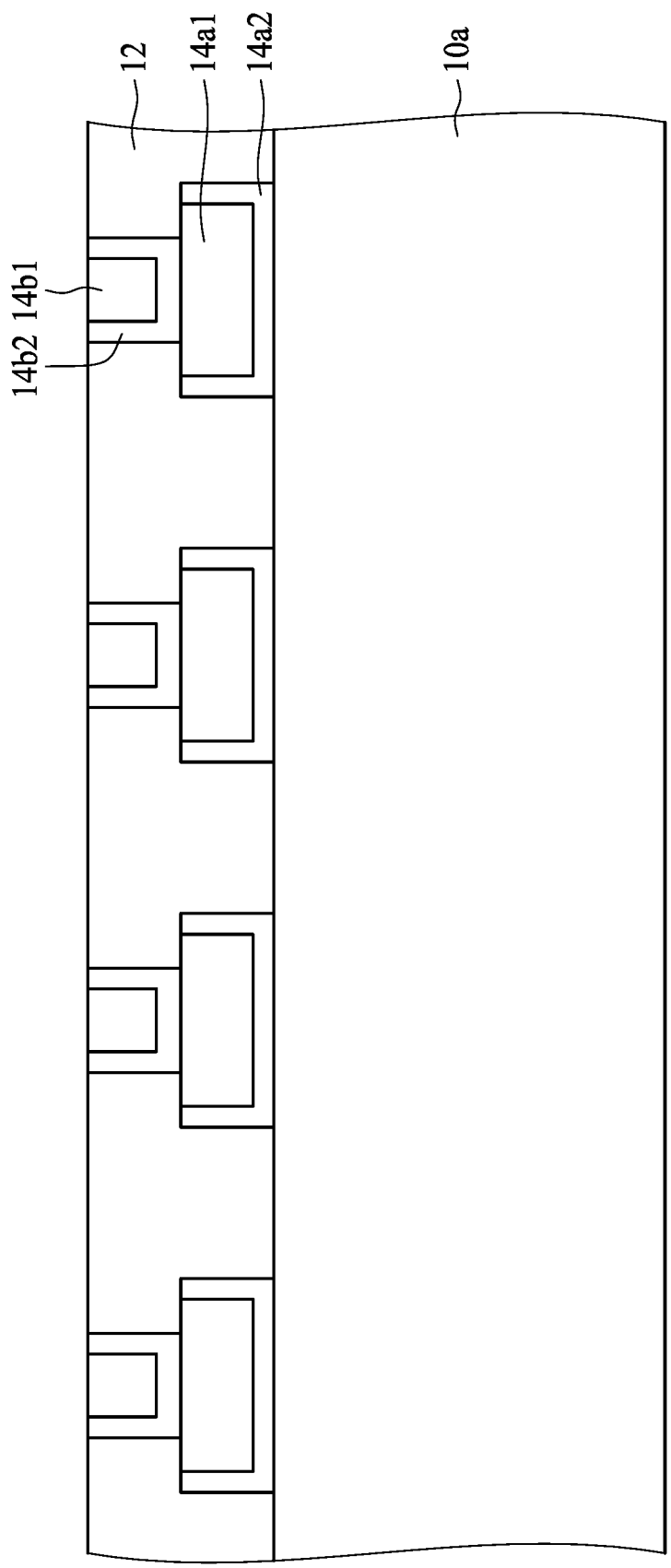

Referring to FIG. 4M, the planarization operation can be performed to expose the interconnection layer 14b2 and the dielectric layer 12. The planarization operation can be formed by, for example but is not limited to, chemical mechanical polishing (CMP), grinding, dry polishing, etching or other suitable technique(s).

Figure 4N:
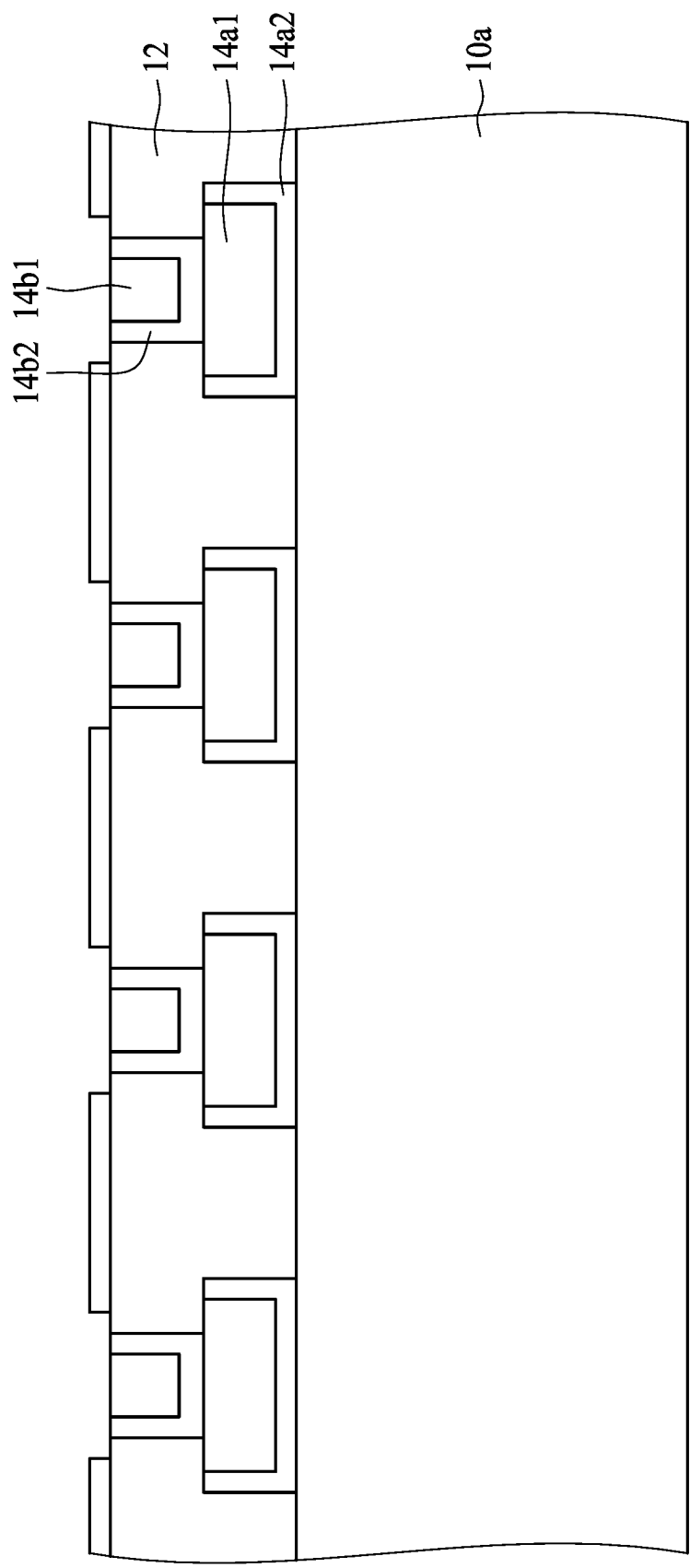

Referring to FIG. 4N, a patterned mask 13c can be formed on the dielectric layer 12 to expose the interconnection layers 14b1 and 14b2. The patterned mask (or photomask) 13c can include, for example but is not limited to, photoresist (PR) material or other suitable material(s). The patterned mask 12c can be formed by, for example but is not limited to, photolithography technique (which may involve coating, exposure, developing) or other suitable technique(s).

Figure 4O:
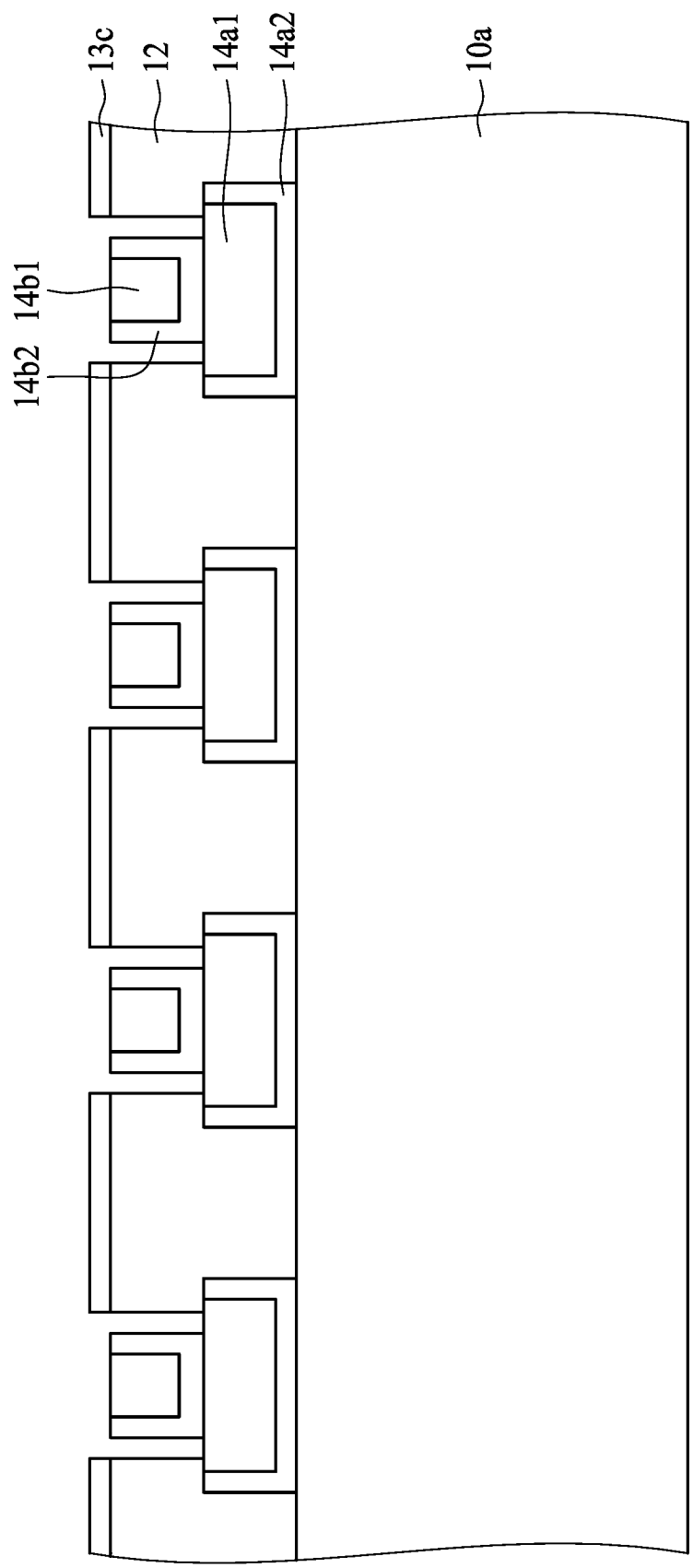

Referring to FIG. 4O, the portions of the dielectric layer 12 which are not covered by the patterned mask 13c can be removed. The removing operation can be performed by, for example but is not limited to, etching (e.g. dry etching) technique or other suitable technique(s).

Figure 4P:
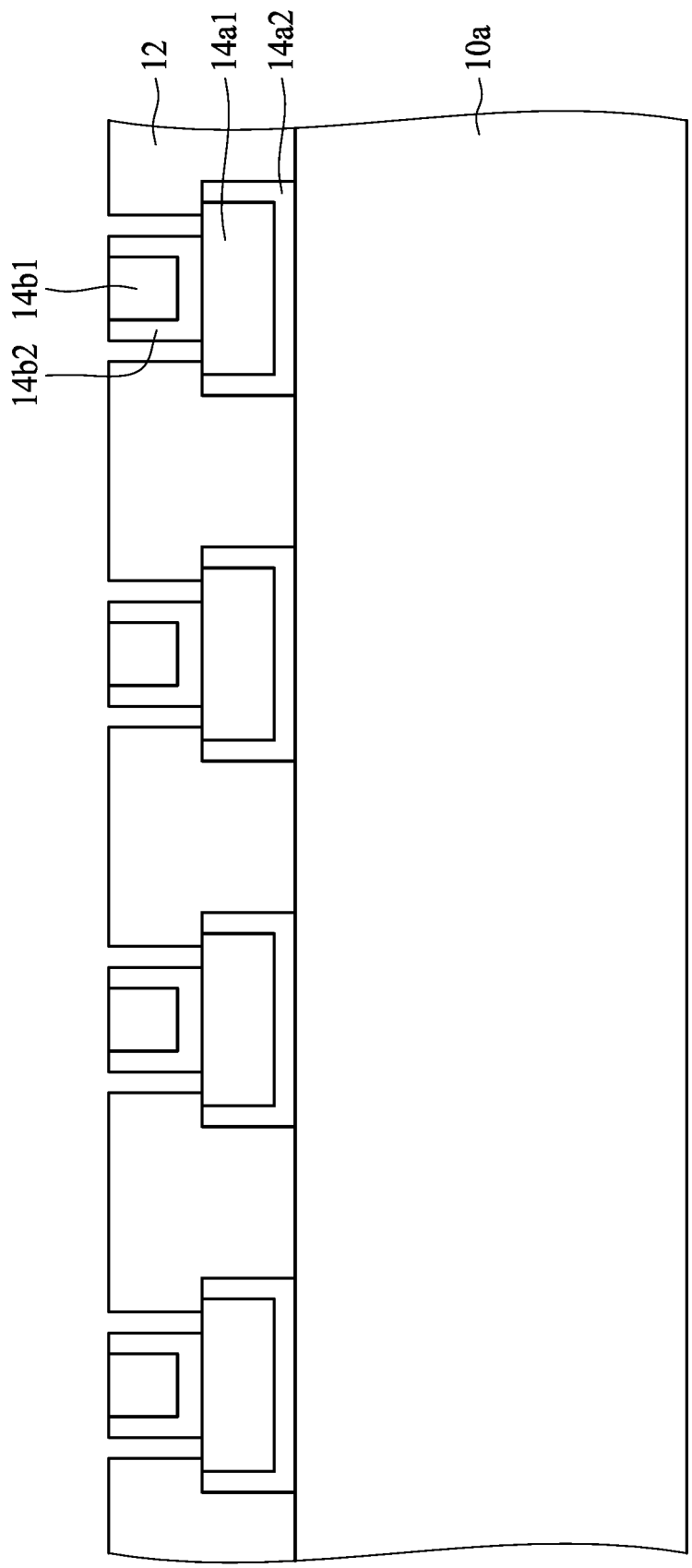

Referring to FIG. 4P, the planarization operation can be performed so that the interconnection layers 14b1 and 14b2 can be substantially coplanar with the dielectric layer 12. The planarization operation can be formed by, for example but is not limited to, chemical mechanical polishing (CMP), grinding, dry polishing, etching or other suitable technique(s).

Figure 5A:
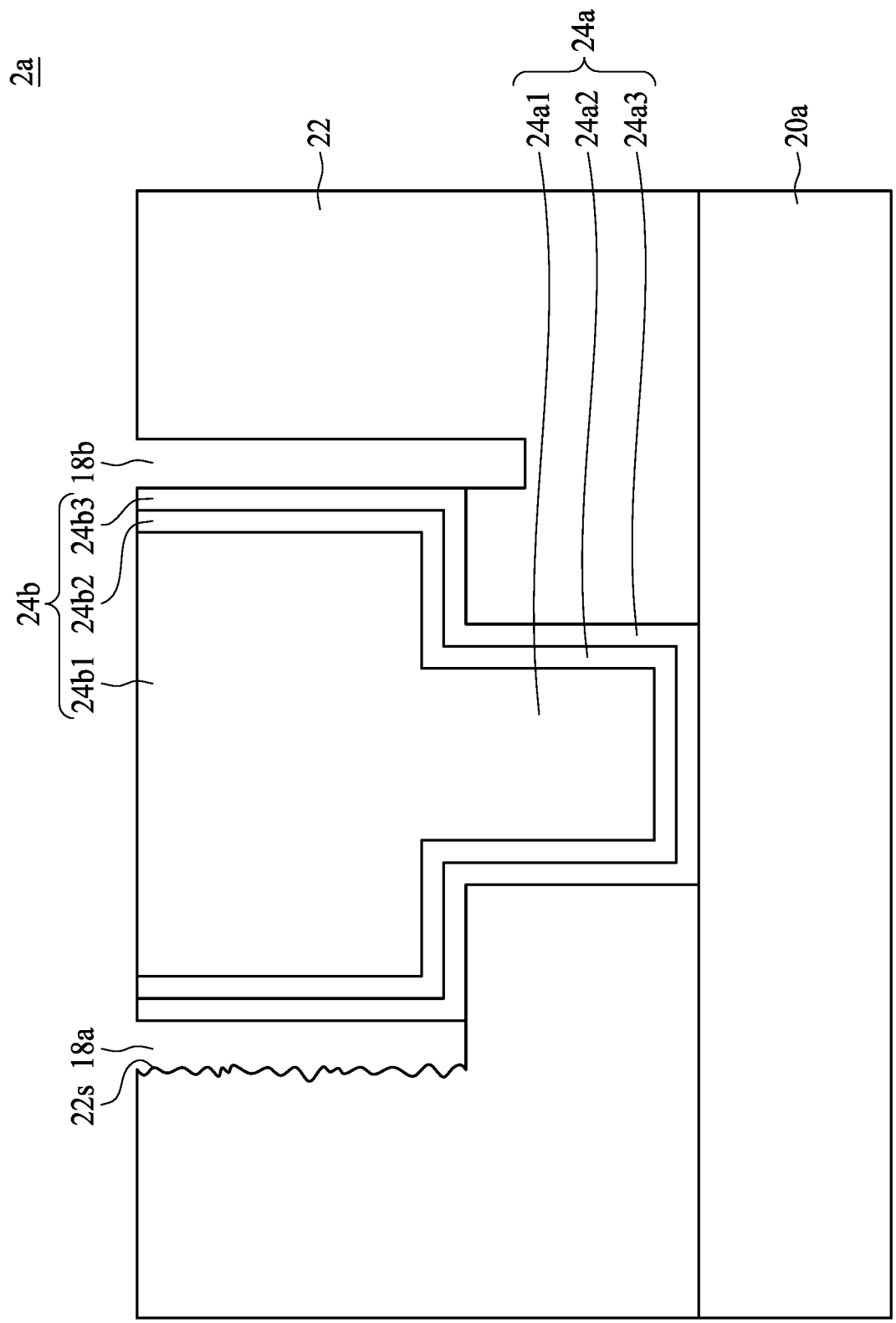
FIG. 5A is a cross-sectional view of another connection structure in accordance with some embodiments of the present disclosure.

FIG. 5A is a cross-sectional view of another connection structure in accordance with some embodiments of the present disclosure.

Referring to FIG. 5A, the connection structure 2a has an interconnection structure 24a and an interconnection structure 24b. The interconnection structure 24a has interconnection layers 24a1, 24a2 and 24a3. The interconnection structure 24b has interconnection layers 24b1, 24b2 and 24b3. The interconnection structure 24a has a relatively less width than the interconnection structure 24b.

The connection structure 2a can be formed by removing the dielectric layer 22 around or adjacent to the interconnection structure 24b. However, a relatively uneven bottom surface (e.g. the bottom surface which defines the space 18a can be higher than the bottom surface which defines the space 18b) may be formed subsequent to the removal of the dielectric layer 22.

Moreover, a relatively rough surface 22s can be formed subsequent to the removal of the dielectric layer 22. Delamination can occur at interface between the dielectric layer 22 and the interconnection structure 24b (e.g. interconnection structure 24b3).

Figure 5B:
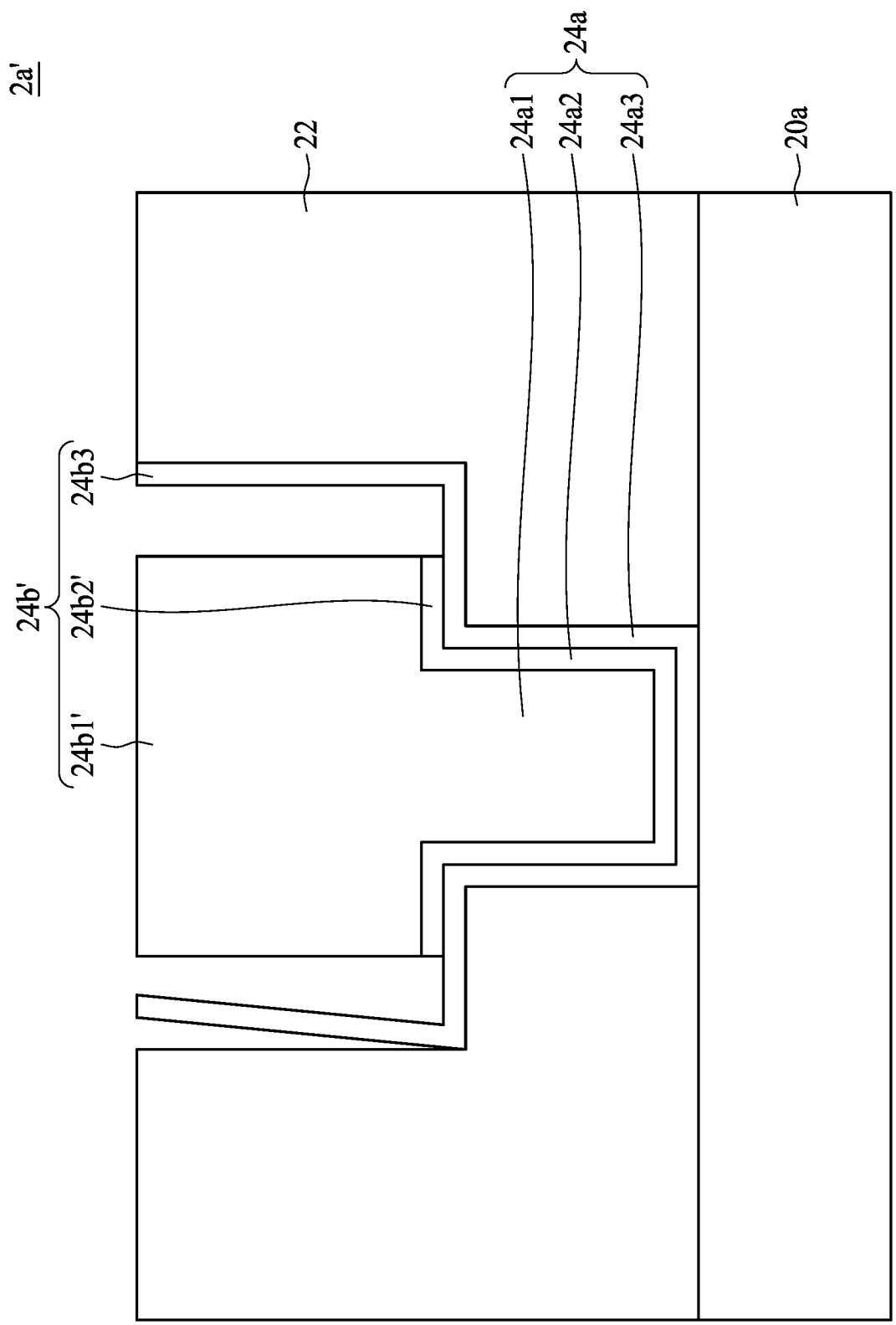
FIG. 5B is a cross-sectional view of another connection structure in accordance with some embodiments of the present disclosure.

FIG. 5B is a cross-sectional view of another connection structure in accordance with some embodiments of the present disclosure.

Referring to FIG. 5B, the connection structure 2a' can be formed by similar process to manufacture the connection structure 2a as shown in FIG. 5A, except that the conductive material is selectively removed but the dielectric layer 22 which is in direct contact with the interconnection layer 24b3 remains. For example, part of the interconnection structure 24b1 and the interconnection layer 24b2 as shown in FIG. 5A can be removed to form the interconnection structure 24b1' and the interconnection structure 24b2', while the interconnection layer 24b3 can remain. The interconnection structure 24a has a relatively less width than the interconnection structure 24b'.

The interconnection layer 24b3 has a relatively great CTE than the dielectric layer 22. Delamination can occur at interface between the dielectric layer 22 and the interconnection structure 24b (e.g. interconnection structure 24b3) during or subsequent to the thermal cycle(s) due to CTE mismatch.

Figure 5C:
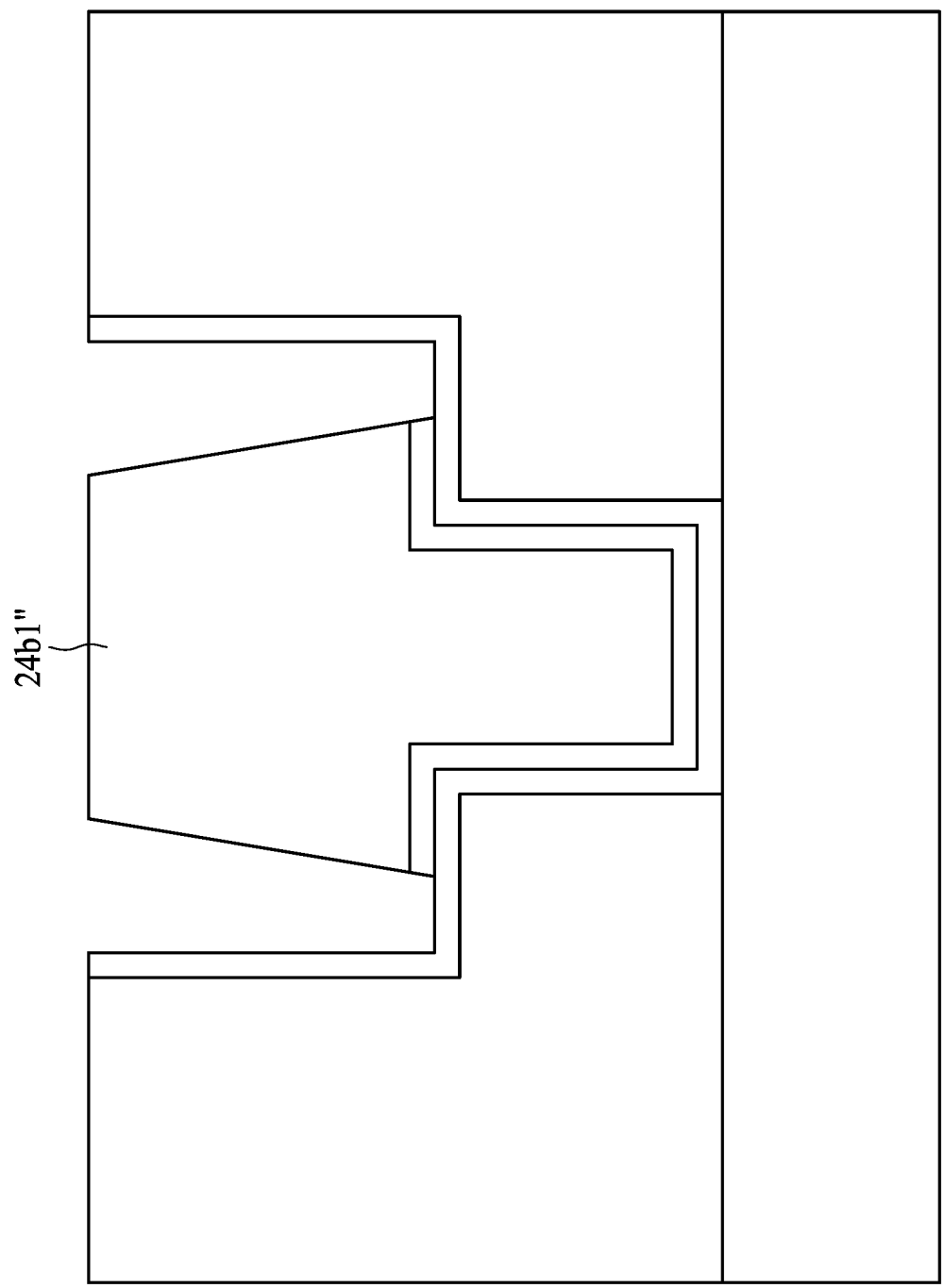
FIG. 5C is a cross-sectional view of another connection structure in accordance with some embodiments of the present disclosure.

FIG. 5C is a cross-sectional view of another connection structure in accordance with some embodiments of the present disclosure.

Referring to FIG. 5C, the connection structure 2a" is similar to the connection structure 2a' as described and illustrated with reference to FIG. 5B, except that the interconnection layer 24b1' is replaced by the interconnection layer 24b1".

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to to given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

The invention claimed is:

1. A semiconductor device package, comprising:
a connection structure having a first portion and a second portion extending from the first portion, the second portion having a width less than the first portion; and
a dielectric layer surrounding the connection structure,
wherein the dielectric layer and the second portion of the connection structure defines a space, the second portion comprises a third interconnection layer and a fourth interconnection layer, the third interconnection layer is formed on the fourth interconnection layer, and at least one portion of a lateral surface of the third interconnection layer is exposed to the space.

2. The semiconductor device package of claim 1, wherein the first portion of the connection structure comprises a first interconnection layer, and wherein the first interconnection layer has a cup structure.

3. The semiconductor device package of claim 2, wherein a portion of the fourth interconnection layer is surrounded by the first interconnection layer.

4. The semiconductor device package of claim 2, wherein the second portion further comprises a fifth interconnection layer on the third interconnection layer, and a lattice of the fifth interconnection layer extends toward at least two different directions from the third interconnection layer.

5. The semiconductor device package of claim 1, wherein the first portion of the connection structure comprises a first interconnection layer, and wherein the first interconnection layer has a U shape or a U shape-like structure.

6. The semiconductor device package of claim 5, wherein the first portion of the connection structure comprises a second interconnection layer surrounding the first interconnection layer.

7. The semiconductor device package of claim 5, wherein a first part of the first portion of the connection structure is covered by the dielectric layer and a second part of the first portion of the connection structure is exposed by the dielectric layer.

8. The semiconductor device package of claim 7, wherein the second part of the first portion of the connection structure, the dielectric layer and the second portion of the connection structure defines the space.

9. The semiconductor device package of claim 1, wherein the second portion further comprises a fifth interconnection layer on the third interconnection layer, and a lattice of the fifth interconnection layer extends toward a direction from the third interconnection layer.

10. The semiconductor device package of claim 9, wherein the direction is (111) direction.

11. The semiconductor device package of claim 1, wherein the third interconnection layer has a U shape or a U shape-like structure.

12. A semiconductor device package, comprising:
a connection structure having a first portion and a second portion disposed on the first portion; and
a dielectric layer exposing part of an upper surface of the first portion of connection structure,
wherein the dielectric layer and the exposed part of the upper surface of the first portion of connection structure defines a space, and the second portion comprises a third interconnection layer and a fourth interconnection layer having widths substantially equal to the third interconnection layer.

13. The semiconductor device package of claim 12, wherein the first portion of the connection structure comprises a first interconnection layer, and wherein the first interconnection layer has a cup structure.

14. The semiconductor device package of claim 12, wherein the first portion of the connection structure comprises a first interconnection layer, and wherein the first interconnection layer has a U shape or a U shape-like structure.

15. The semiconductor device package of claim 14, wherein the first portion of the connection structure comprises a second interconnection layer surrounding the first interconnection layer.

16. The semiconductor device package of claim 14, wherein a first part of the first portion of the connection structure is covered by the dielectric layer and a second part of the first portion of the connection structure is exposed by the dielectric layer.

17. The semiconductor device package of claim 14, wherein parts of the first interconnection layer and the second interconnection layer are covered by the dielectric layer.

18. The semiconductor device package of claim 17, wherein a portion of an upper surface of the first portion is exposed to the space.

19. The semiconductor device package of claim 17, wherein the fourth interconnection layer surrounds the third interconnection layer as a U shape or a U-shape like structure.

20. The semiconductor device package of claim 19, wherein a lateral surface of the fourth interconnection layer is exposed to the space.

21. The semiconductor device package of claim 19, wherein a lattice of the third interconnection layer extends toward at least two different directions from the fourth interconnection layer.

22. The semiconductor device package of claim 12, wherein at least a portion of a lateral surface of the third interconnection layer is exposed to the space.

23. The semiconductor device package of claim 12, wherein a lattice of the third interconnection layer extends toward a direction from the fourth interconnection layer.

24. A method of manufacturing a semiconductor device package, comprising:
    forming a first portion of a connection structure on a substrate;
    forming a second portion of a connection structure on the first portion, wherein the second portion comprises a third interconnection layer and a fourth interconnection layer having widths substantially equal to the third interconnection layer; and
    forming a dielectric layer to surround the connection structure and to define a space with the connection structure.

25. The method of claim 24, further comprising:
    forming a first interconnection layer of the first portion; and
    forming a fifth interconnection layer of the second portion having a width less than the first interconnection layer.

26. The method of claim 25, wherein a lateral surface of the fifth interconnection layer is exposed to the space.

27. The method of claim 26, further comprising forming the third interconnection layer of the second portion to surround the fifth interconnection layer as a U shape or a U-like shape.

* * * * *